(12) United States Patent
Matsumoto et al.

(10) Patent No.: US 7,990,177 B2
(45) Date of Patent: Aug. 2, 2011

(54) DRIVER CIRCUIT FOR PRODUCING SIGNAL SIMULATING TRANSMISSION LOSS

(75) Inventors: Naoki Matsumoto, Tokyo (JP); Takashi Sekino, Tokyo (JP); Takayuki Nakamura, Tokyo (JP)

(73) Assignee: Advantest Corp., Tokyo (JP)

( * ) Notice: Subject to any disclaimer, the term of this patent is extended or adjusted under 35 U.S.C. 154(b) by 6 days.

(21) Appl. No.: 12/584,456

(22) Filed: Sep. 4, 2009

(65) Prior Publication Data
US 2010/0109788 A1    May 6, 2010

Related U.S. Application Data

(63) Continuation of application No. PCT/JP2008/053149, filed on Feb. 25, 2008.

(30) Foreign Application Priority Data

Mar. 7, 2007    (JP) .................................. 2007-056983

(51) Int. Cl.
*H03K 19/0175*    (2006.01)
(52) U.S. Cl. ........................................... 326/82; 326/86
(58) Field of Classification Search ................ 326/82–87
See application file for complete search history.

(56) References Cited

U.S. PATENT DOCUMENTS

| | | | |
|---|---|---|---|
| 5,898,326 A | 4/1999 | Okayasu | |
| 6,360,180 B1 | 3/2002 | Breger | |
| 2003/0193351 A1* | 10/2003 | Fukui | ............... 326/83 |
| 2004/0013188 A1* | 1/2004 | Tonietto et al. | ............... 375/229 |
| 2006/0280239 A1* | 12/2006 | Moll et al. | ............... 375/224 |
| 2007/0103198 A1 | 5/2007 | Matsumoto et al. | |
| 2007/0230355 A1 | 10/2007 | Ueda | |
| 2008/0239966 A1 | 10/2008 | Ueda | |

FOREIGN PATENT DOCUMENTS

| | | |
|---|---|---|
| JP | 10-190747 | 7/1998 |
| JP | 2002-544489 | 12/2002 |
| JP | 2006-345532 | 12/2006 |
| WO | WO 2006/129491 | 12/2006 |
| WO | WO 2007/049674 | 5/2007 |
| WO | WO 2007/116765 | 10/2007 |

* cited by examiner

*Primary Examiner* — Rexford N Barnie
*Assistant Examiner* — Thienvu V Tran
(74) *Attorney, Agent, or Firm* — Muramatsu & Associates

(57) ABSTRACT

In a driver circuit 10 for outputting a simulated signal simulating an input signal subjected to transmission loss, corresponding to the input signal, the driver circuit 10 comprises: a main driver 18 which receives the input signal and outputs an output signal corresponding to the input signal; a sub driver 20 which receives the input signal and outputs an output signal given by inverting the input signal; a high frequency emphasizing circuit 22 which receives the input signal of the sub driver 20 and outputs an output signal having the high frequency of the input signal of the sub driver 20 emphasized; and an addition unit 24 which outputs the simulated signal given by adding the output signal of the main driver 18 and the output signal of the high frequency emphasizing circuit 22.

7 Claims, 24 Drawing Sheets

POINT A, POINT B

POINT C

POINT D

POINT E

POINT A, POINT B

POINT C

POINT D

POINT F

POINT G

POINT A, POINT B

POINT C

POINT D

POINT F

POINT G

FIG. 19A INPUT
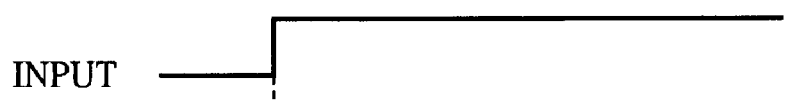
FIG. 19B $V_1$
FIG. 19C $V_2$
FIG. 19D $V_3$
FIG. 19E $V_{out}$
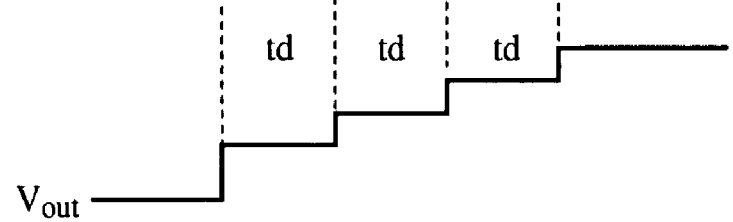

FIG. 21A INPUT
FIG. 21B $V_1$
FIG. 21C $V_2$
FIG. 21D $V_3$
FIG. 21E $V_{out}$
td  td  td
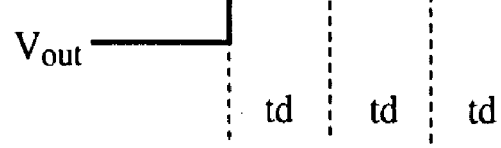

INPUT $V_{1B}$ $V_{2B}$ $V_{3B}$ $V_{out}$ td　td　td

PAT $i_1$ $i_2$ $i_3$ $V_{out}$ $V_{out}$

DRIVER CIRCUIT FOR PRODUCING SIGNAL SIMULATING TRANSMISSION LOSS This application is a continuation of prior International Patent Application No. PCT/JP2008/053149 filed Feb. 25, 2008 which claims the benefit of Japanese Patent Application No. 2007-056983 filed Mar. 7, 2007, the entire contents of which are incorporated herein by reference.

TECHNICAL FIELD

The present invention relates to a driver circuit for supplying signals to a circuit connected to the driver circuit.

BACKGROUND ART

The semiconductor test device is a device which tests the operation of a device under test (hereinafter called DUT) by inputting signals of prescribed pattern data to the DUT, reading the output data of the DUT resulted from the input signals, and comparing the output data with the expected data.

Recently, as the transfer bit rate of the CPU, MPU, memories, etc. increases, it becomes necessary to compensate the transmission loss at connections between respective LSIs. Usually, the transmission line has integration characteristics, and thus, the high frequency component of a signal is lost. To cope with such a problem, a high frequency emphasizing circuit for compensating the transmission loss is often provided in an LSI as disclosed by Japanese Patent No. 3509258.

The LSI incorporating such a high frequency emphasizing circuit must be tested as to whether or not the high frequency emphasizing circuit operates correctly.

DISCLOSURE OF THE INVENTION

Problems to be Solved by the Invention

The semiconductor test device which tests the high frequency emphasizing circuit incorporated in a DUT for compensating a transmission loss preferably can generate signals simulating signals that have experienced transmission losses under arbitrary loss conditions in addition to test various DUTs.

Means for Solving the Problems

The above-described object is attained by a driver circuit for outputting a signal simulating an input signal subjected to transmission loss, the driver circuit comprising: a main driver which receives the input signal and outputs a first signal corresponding to the input signal; a sub driver which receives the input signal and outputs a second signal by inverting the input signal; a high frequency emphasizing circuit which receives the second signal and outputs a third signal in which the high frequency of the second signal is emphasized; and an addition unit which outputs the simulated signal produced by adding the first signal and the third signal.

In the above-described drive circuit, it is possible that the high frequency emphasizing circuit is a differential circuit for outputting the third signal given by differentiating the second signal.

In the above-described drive circuit, it is possible that the driver circuit which further comprises an amplification circuit which receives the simulated signal and amplifies the simulated signal.

In the above-described driver circuit, it is possible that the driver circuit further comprises a multiplication circuit which receives the third signal and adjusts the amplitude of the third signal, and that the addition unit outputs the simulated signal produced by adding the first signal and the third signal whose amplitude has been adjusted by the multiplication circuit.

In the above-described driver circuit, it is possible that the sub driver is a differential driver which outputs the second signal given by inverting the input signal, and a fourth signal corresponding to the input signal; that the driver circuit further comprises an additional high frequency emphasizing circuit which receives the fourth signal and outputs a fifth signal having the high frequency of the fourth signal emphasized; and that the addition unit outputs a signal given by adding the fifth signal to the simulated signal or the first signal.

In the above-described driver circuit, it is possible that the high frequency emphasizing circuit outputting the third signal, and the additional high frequency emphasizing circuit outputting the fifth signal are formed of a common differentiating circuit.

In the above-described driver circuit, it is possible that the driver circuit further comprises a phase modulation circuit which modifies a phase of the input signal to be inputted to the main driver and the sub driver.

The above-described object is attained by a driver circuit for outputting a signal simulating an input signal subjected to transmission loss, the driver circuit comprising: a main driver which receives the input signal and outputs a first signal corresponding to the input signal; a plurality of sub drivers which receive the input signal and output a plurality of second signals by inverting the input signal; a plurality of high frequency emphasizing circuits having time constants different from each other, which respectively receive the plural second signals from the plural sub drivers and output third signals having the high frequency of the second signals emphasized; a plurality of multiplication circuits which respectively receive the plural third signals from the plural high frequency emphasizing circuits and adjust the amplitude of the third signals; and an addition unit which outputs the simulated signal by adding the first signal to the plural third signals having the amplitude adjusted by the plural multiplication circuits.

Effect of the Invention

The driver circuit according to the present invention for outputting a simulated signal simulating the transmission loss, the driver circuit comprises: a main driver which receives the input signal and outputs a first signal corresponding to the input signal; a sub driver which receives the input signal and outputs a second signal by inverting the input signal; a high frequency emphasizing circuit which receives the second signal and outputs a third signal having the high frequency of the second signal emphasized; and an addition unit which outputs the simulated signal by adding the first signal and the third signal, whereby a signal simulating a signal subjected to transmission loss can be generated without the need of a complicated circuit structure.

BRIEF DESCRIPTION OF THE DRAWINGS

FIG. 19 shows the waveforms of signals at respective points of the driver circuit according to the seventh embodiment of the present invention.

FIG. 21 is a view (Part 1) showing the waveforms of signals at respective points of the driver circuits according to the eighth embodiment of the present invention.

REFERENCE NUMBERS

Figure 1:
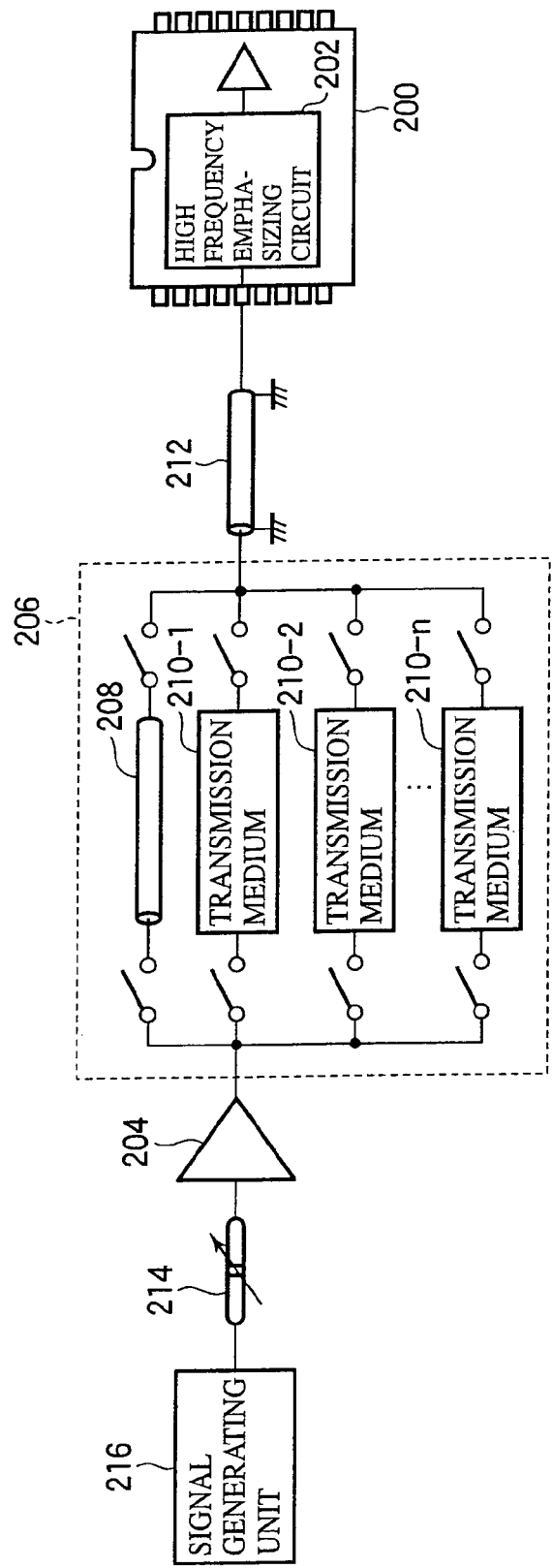
FIG. 1 is a block diagram illustrating the structure of the transmission loss simulating circuit using the loss selecting circuit.

10 . . . driver circuit
12 . . . DUT
14 . . . high frequency emphasizing circuit
16 . . . signal generating unit
18 . . . main driver
20 . . . sub driver
20-1, . . . , 20-n . . . sub driver
22 . . . high frequency emphasizing circuit
22-1, . . . , 22-n . . . addition circuit
26 . . . loss-free transmission line
28, 30, 32, 34 . . . transistor
36, 38 . . . resistor
40 . . . constant current circuit
42, 44, 46, 48 . . . transistor
50, 52 . . . constant current circuit
54 . . . resistor
56 . . . condenser
58, 60 . . . drive power source
62 . . . driver circuit
64 . . . amplification circuit
66 . . . driver circuit
68 . . . multiplication circuit
68-1, . . . , 68-n . . . multiplication circuit
70, 72 . . . transistor
74 . . . driver circuit
76 . . . addition unit
78 . . . driver circuit
80 . . . sub driver
82 . . . high frequency emphasizing circuit
84 . . . high frequency emphasizing circuit
86, 88 . . . multiplication circuit
90 . . . addition unit
92, 94 . . . addition circuit
96, 98 . . . transistor
100, 102 . . . constant current circuit
104 . . . resistor
106 . . . condenser
108, 110, 112, 114 . . . transistor
116 . . . driver circuit
118 . . . phase modulation circuit
120, 122 . . . driver
124 . . . low-pass filter
126 . . . multiplication circuit
128 . . . addition circuit
130 . . . comparator
132 . . . driver circuit
134-1, 134-2, 134-3 . . . variable delay circuit
136-1, 136-2, 136-3 . . . sub driver
128 . . . multiplication unit
140-1, 140-2, 140-3 . . . addition circuit
142 . . . driver circuit
144-1, 144-2, 144-3 . . . sub driver
146-1, 146-2, 146-3 . . . select switch
148 . . . addition unit
150-1, 15-2, 150-3 . . . addition circuit
152, 154 . . . transistor
156 . . . variable constant current circuit
158, 160, 162, 164 . . . transistor
200 . . . DUT
202 . . . high frequency emphasizing circuit
204 . . . driver
206 . . . loss selecting circuit
208 . . . loss-free transmission medium
210-1, 210-2, . . . 210-n . . . transmission medium
212 . . . loss-free transmission line 214 . . . phase modulation circuit
216 . . . signal generating unit

BEST MODE FOR CARRYING OUT THE INVENTION

[Technique using Loss Selecting Circuit]

To test a high frequency emphasizing circuit incorporated in a device under test (hereinafter called a DUT) so as to compensate a transmission loss, it is necessary to supply to the DUT a simulated signal simulating a signal subjected to transmission loss. It is preferable that a loss of a simulated signal can be suitably varied depending on test conditions of the high frequency emphasizing circuit.

A structure of the transmission loss simulating circuit which can vary the amount of simulated transmission loss will be achieved, for example, by a loss selecting circuit which selectively switches a plurality of transmission mediums of different transmission losses to interconnect the driver and a DUT.

The structure of the transmission loss simulating circuit using the loss selecting circuit will be explained with reference to FIGS. 1 and 2. FIG. 1 is a block diagram showing a structure of the transmission loss simulating circuit using the loss selecting circuit, and FIG. 2 is a diagram showing the waveforms of a simulated signal generated by the transmission loss simulating circuit using the loss selecting circuit.

As illustrated in FIG. 1, a high frequency emphasizing circuit 202 for compensating transmission losses is incorporated in a DUT 200.

To the output terminal of a driver 204, the input terminal of the loss selecting circuit 206 is connected.

To the output terminal of the loss selecting circuit 206, the input terminal of the DUT 200 is connected to a loss-free transmission line 212.

To the input terminal of the driver 204, a signal generating unit 216 is connected via a phase modulation circuit 214.

To the driver 204, a signal which is generated by the signal generating unit 216 and having the phase modulated by the phase modulation circuit 214 is inputted as an input signal.

The driver 204 outputs an output signal of a waveform corresponding to the input signal inputted via the phase modulation circuit 214 to supply the output signal to the loss selecting circuit 206.

The loss selecting circuit 206 includes a loss-free transmission medium 208 and a plurality of transmission mediums 210-1, 210-2, . . . , 210-n whose transmission losses are different from each other. The loss selecting circuit 206, depending on test conditions of the DUT 200, selects one of the plural transmission mediums 210-1, 210-2, . . . , 210-n, and connect the selected transmission medium between the driver 204 and the loss-free transmission line 212.

The signal supplied from the driver 204 to the loss selecting circuit 206 passes through the selected transmission medium in the loss selecting circuit 206 and is supplied to the DUT 200 via a loss-free transmission line 212.

Figure 2A:
FIG. 2 shows the waveforms of simulated signals generated by the transmission loss simulating circuit using the loss selecting circuit.
Figure 2B:
Figure 2C:

FIG. 2 shows waveforms of signals to be inputted to the DUT 200. FIG. 2A illustrates the waveform when the transmission medium 210-1 is selected, FIG. 2B is the waveform when the transmission medium 210 whose loss is larger than the transmission medium 210-1 is selected, and FIG. 2C illustrates the waveform when the transmission medium 210-n whose loss is larger than the transmission medium 210-2 is larger is selected.

The transmission mediums interconnected between the driver 204 and the DUT 200 are switched in the loss selecting circuit 206, whereby, as illustrated in FIGS. 2A to 2C, simulated signals having different losses can be inputted to the DUT 200.

Thus, a simulated signal having a required loss generated in the loss selecting circuit 206 is supplied to the DUT 200, and the high frequency emphasizing circuit 202 incorporated in the DUT 200 is tested.

However, the circuit structure using the loss selecting circuit 206 illustrated in FIG. 1 has the demerits described below.

First, switching the transmission mediums in the loss selecting circuit 206 largely varies the propagation delay time between the driver 204 and the DUT 200 depending on selected one of the transmission mediums. That is, the transmission medium having larger transmission loss has a larger propagation delay time. Accordingly, it is necessary to modulate by the phase modulation circuit 214 the phase of an input signal to the driver 204 and to correct the timing of the signal in advance. Resultantly, the circuit structure becomes complicated.

The driver circuit according to the present invention, however, variably generates simulated signals simulating signals subjected to transmission losses to thereby correctly test the high frequency emphasizing circuit incorporated in a DUT. The driver circuit according to the present invention will be explained with reference to embodiments.

First Embodiment

Figure 3:
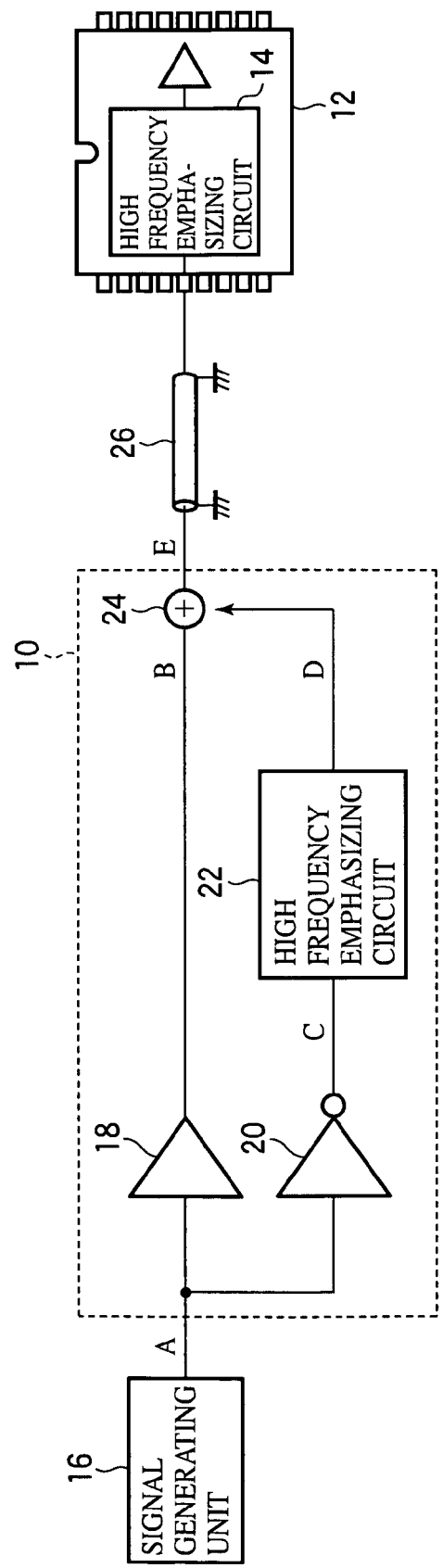
FIG. 3 is a block diagram illustrating the structure of the driver circuit according to a first embodiment of the present invention.

The driver circuit according to a first embodiment of the present invention will be explained with reference to FIGS. 3 to 5. FIG. 3 is a block diagram showing a structure of the driver circuit according to the present embodiment. FIG. 4 shows the waveforms of signals at respective points of the driver circuit according to the present embodiment. FIG. 5 is a circuit diagram showing a structure of the driver circuit according to the present embodiment.

The driver circuit 10 according to the present embodiment is a driver circuit incorporated in a semiconductor test device for testing the high frequency emphasizing circuit 14 incorporated in a DUT 12 to compensate a transmission loss, and receives an input signal from the signal generating unit 16, generates a simulated signal simulating a signal subjected to a transmission loss and supplies the simulated signal to the DUT 12.

As illustrated in FIG. 3, the driver circuit 10 according to the present embodiment comprises a main driver 18, a sub driver 20 for inverted output, a high frequency emphasizing circuit 22 and an addition circuit 24.

To the driver circuit 10 according to the present embodiment, a signal of a prescribed waveform generated by the signal generating unit 16 is inputted as an input signal. As the signal generated by the signal generating unit 16, for example, a rectangular waveform pulse signal of a prescribed pulse width and amplitude is used.

The main driver 18 receives an input signal from the signal generating unit 16 and outputs an output signal of the same waveform as that of the input signal.

The sub driver 20 receives an input signal from the signal generating unit 16 and outputs an output signal of the inverted waveform of the input signal.

The high frequency emphasizing circuit 22 receives an input signal from the sub driver 20, passes the high frequency component of the input signal and outputs an output signal having the high frequency of the input signal emphasized. The high frequency emphasizing circuit 22 is a bypass filter, specifically an RC differentiating circuit and outputs a differential signal of the output signal of the sub driver 20.

The addition circuit 24 receives an output signal of the main driver 18 and an outputs signal of the high frequency emphasizing circuit 22 and outputs an output signal by adding the output signal of the high frequency emphasizing circuit 22 to the output signal of the main driver 18.

As described above, the driver circuit 10 according to the present embodiment adds the output signal of the main driver 18 to the output signal of the high frequency circuit 22 whose input source is the inverted output of the sub driver 20, whereby a signal simulating a signal subjected to a transmission loss of a prescribed loss is generated.

The output signal of the addition circuit 24 is inputted to the DUT 12 via the loss-free transmission line 26. Thus, the signal simulating the transmission loss is supplied to the DUT 12, and the high frequency emphasizing circuit 14 incorporated in the DUT 12 is tested.

The driver circuit 10 according to the present embodiment is characterized mainly in that the driver circuit 10 includes the sub driver 20 which outputs an inverted signal of a signal generated by the signal generating unit 16, the high frequency emphasizing circuit 22 which outputs a signal having the high frequency of the output signal of the sub-diver 20 emphasized, and the addition circuit 24 which adds an output signal of the main driver 18 to an output signal of the high frequency emphasizing circuit 22 whose input source is an inverted output of the sub driver 20.

FIG. 4 is a diagram showing waveforms of signals at Point A to Point D illustrated in FIG. 3. FIG. 4A illustrates the waveform of a signal generated by the signal generating unit 16 (the signal at Point A) and the waveform of an output signal of the main driver 18 (the signal at Point B). FIG. 4B illustrates the waveform of an inverted output signal of the sub driver 20 (the signal at Point C). FIG. 4C illustrates the waveform of an output signal of the high frequency emphasizing circuit 22 (the signal at Point D). FIG. 4D illustrates the waveform of an output signal of the addition circuit 24 (the signal at Point E).

Figure 4A:
FIG. 4 shows the waveforms of signals at respective points of the driver circuit according to the first embodiment of the present invention.
Figure 5:
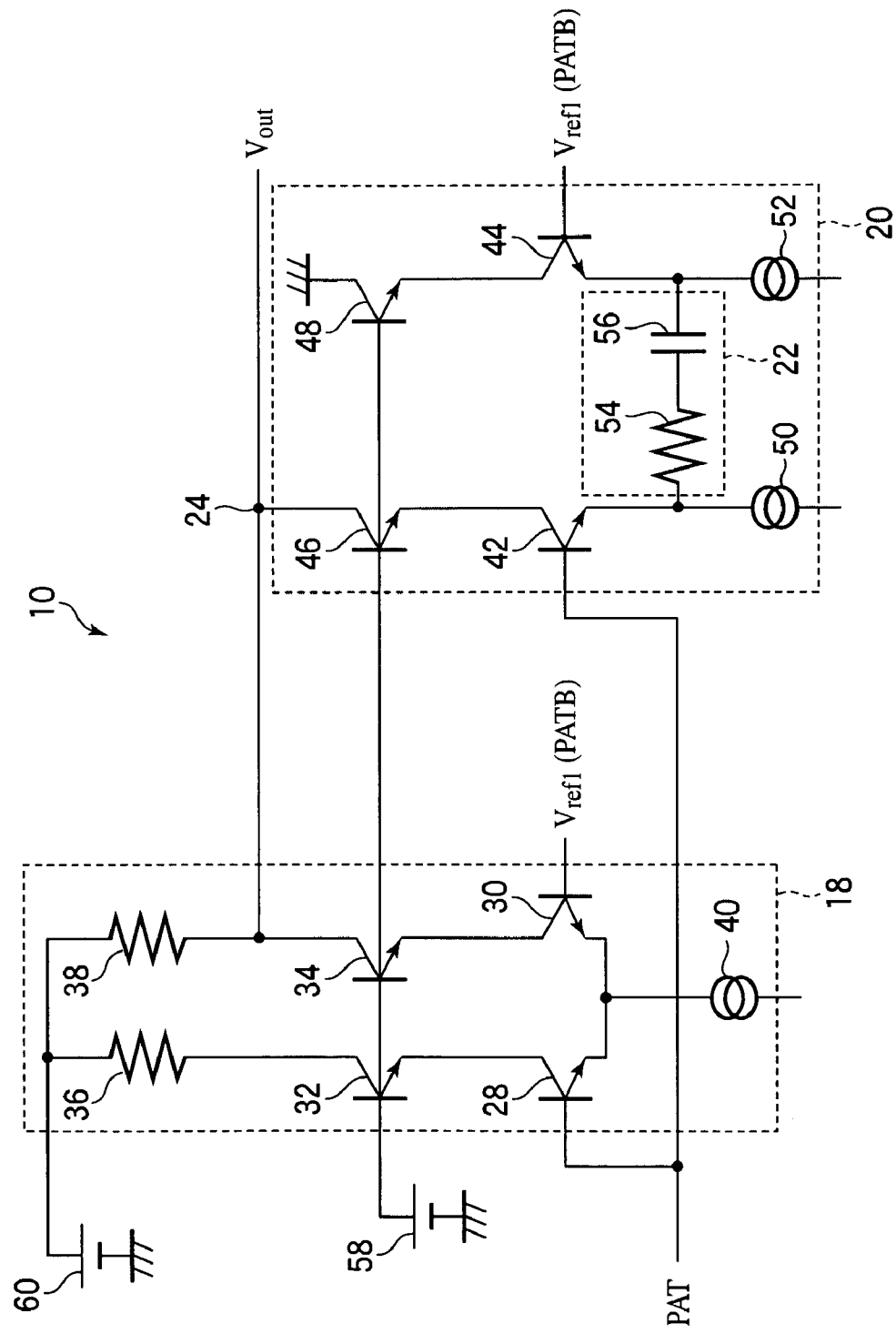
FIG. 5 is a circuit diagram illustrating an example of circuit structure of the driver circuit according to the first embodiment of the present invention.

As illustrated in FIG. 4A, the output signal of the main driver 18 is a signal of the same waveform of that of a signal generated by the signal generating unit 16.

Figure 4B:

As illustrated in FIG. 4B, the signal of the sub driver 20, however, is an inverted signal of the inverted waveform of a signal generated by signal generating unit 16.

Figure 4C:
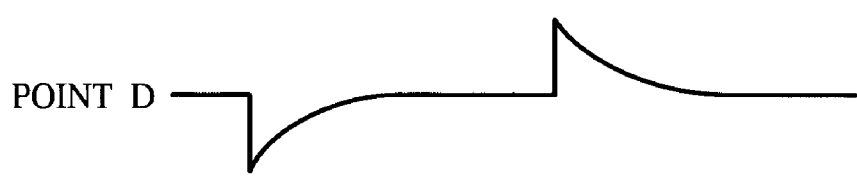

As illustrated in FIG. 4C, the output signal of the high frequency emphasizing circuit 22 is a signal having the high frequency of an output signal of the sub driver 20 illustrated in FIG. 4B emphasized, specifically, a signal given by differentiating the output signal of the sub driver 20.

Figure 4D:

As illustrated in FIG. 4D, the output signal of the addition circuit 24 is a signal of the waveform obtained by adding the output signal of the main driver 18 to the output signal of the high frequency emphasizing circuit 22. As described above, the driver circuit 10 according to the present embodiment adds the output signal of the high frequency emphasizing circuit 22 the output signal of the main driver 18 to thereby generate a signal emphasizing the low frequency of the output signal of the main driver 18 having a waveform whose rising edge and falling edge are blunt, i.e., a simulated signal simulating a signal having the high frequency component degraded due to transmission loss.

Next, the specific circuit structure of the driver circuit according to the present embodiment will be explained with reference to FIG. 5.

The main driver 18 comprises two transistors 28, 30, two transistors 32, 34 having the emitters connected to the respective sources of the transistors 28, 30, two resistors 36, 38 as load resistances respectively connected to the collectors of the transistors 32, 34 and a constant current circuit 40 connected commonly to the emitters of the transistors 28, 30.

The sub driver 20 comprises two transistors 42, 44, two transistors 46, 48 having the emitters connected to the respective collectors of the transistors 42, 44 and constant current circuits 50, 52 connected to the respective emitters of the transistors 42, 44.

The high frequency emphasizing circuit 22 is a differential circuit comprising a resistor and a condenser 56 serially connected between the emitter of the transistor 42 and the emitter of the transistor 44.

A drive power source 58 is connected to the bases of the transistors 32, 34 of the main driver 18 and the bases of the transistors 46, 48 of the sub driver 20. A drive power source 60 is connected to the resistors 36, 38 of the main driver 18.

In the main driver 18, a signal PAT generated by the signal generating unit 16 is inputted to the base of one transistor 28. To the base of the other transistor 30, a signal of a prescribed reference voltage $V_{ref1}$(PATB) is inputted. Thus, from the collector of the transistor 34 connected to the collector of the transistor 30, a signal of the same phase as that of the signal inputted to the base of the transistor 28 is produced. This signal is outputted as an output signal of the main driver 18.

In the sub driver 20, as in the main driver 18, to the base of one transistor 42, the signal PAT generated by the signal generating unit 16 is inputted. To the base of the other transistor 44, a signal of the prescribed reference voltage $V_{ref1}$ (PATB) is inputted. Thus, from the collector of the transistor 46 connected to the collector of the transistor 42, a signal of the inverted waveform of the signal inputted to the base of the transistor 42 is produced. The signal outputted from the collector of the transistor 46 has the high frequency emphasized by the high frequency emphasizing circuit 22 formed in a differentiating circuit, and thus, only the high frequency component higher than a cut off frequency determined by the time constant of the differentiating circuit is outputted. The signal outputted from the collector of the transistor 46 is outputted as an output signal of the high frequency emphasizing circuit 22 (as an inverted output signal of the sub driver 20).

The output signal of the main driver 18 and the output signal of the high frequency emphasizing circuit 22 are combined by the addition circuit 24. Thus, a simulated signal simulating a signal subjected to transmission loss is generated and is outputted as an output signal $V_{out}$ of the driver circuit 10.

Thus, according to the present embodiment, without the need of a complicate circuit structure, a simulated signal simulating a signal subjected to transmission loss can be generated, and the high frequency emphasizing circuit incorporated in a DUT can be correctly tested.

Second Embodiment

The drive circuit according to a second embodiment of the present invention will be explained with reference to FIG. 6 which is a block diagram showing a structure of the driver circuit according to the present embodiment. The same members of the present embodiment as those of the driver circuit according to the first embodiment are represented by the same reference numbers.

The driver circuit 62 according to the present embodiment includes an amplification circuit 64 for amplifying an output signal outputted from the addition circuit 24 in addition to the structure of the driver circuit 10 according to the first embodiment illustrated in FIG. 3.

Figure 6:
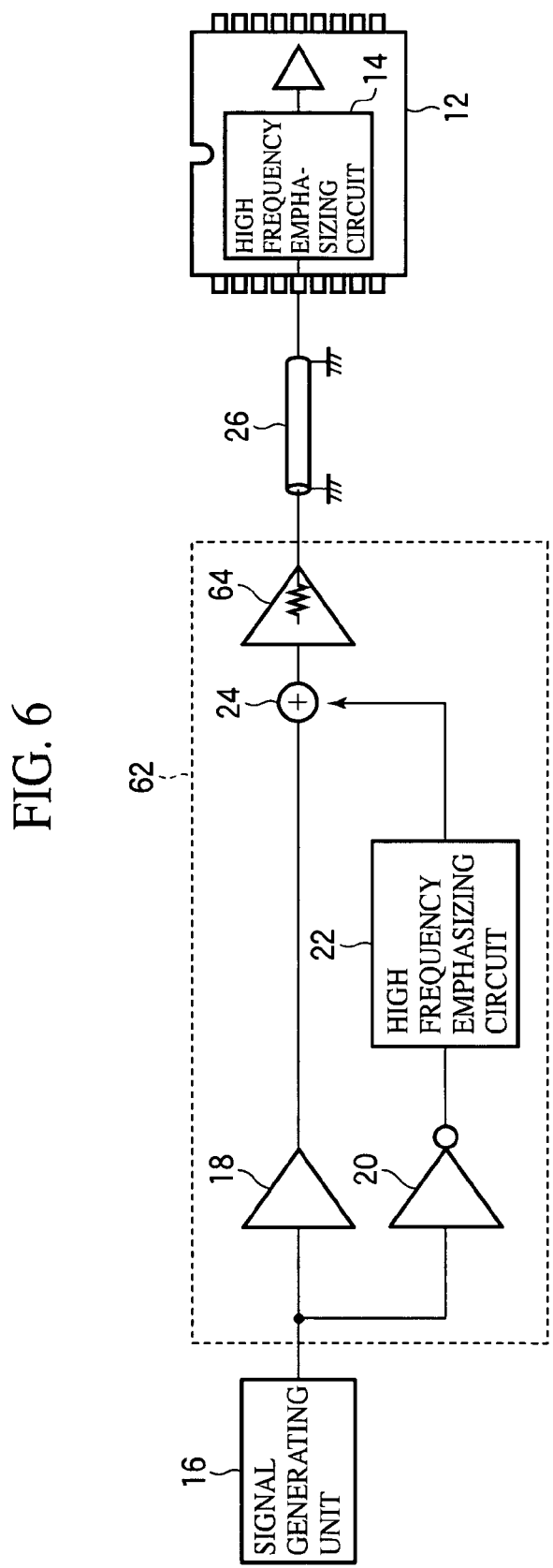
FIG. 6 is a block diagram illustrating the structure of the driver circuit according to a second embodiment of the present invention.

As illustrated in FIG. 6, the amplification circuit 64 of the driver circuit 62 according to the present embodiment receives an input signal from the addition circuit 24 and outputs a signal by amplifying the input signal. The output signal of the amplification circuit 64 is supplied to a DUT 12 via the loss-free transmission line 26. The amplification circuit 64 here has substantially the same output impedance as that of the loss-free transmission line 26, which transmits the output signal of the amplification circuit 64 to the DUT 12 and accordingly, is impedance-matched with the loss-free transmission line 26.

As described above, the driver circuit 62 according to the present embodiment further comprises the amplification circuit 64 for amplifying an output signal of the addition circuit 24, whereby the power consumption of the main driver 18 and the sub driver 20 can be decreased.

Third Embodiment

Figure 7:
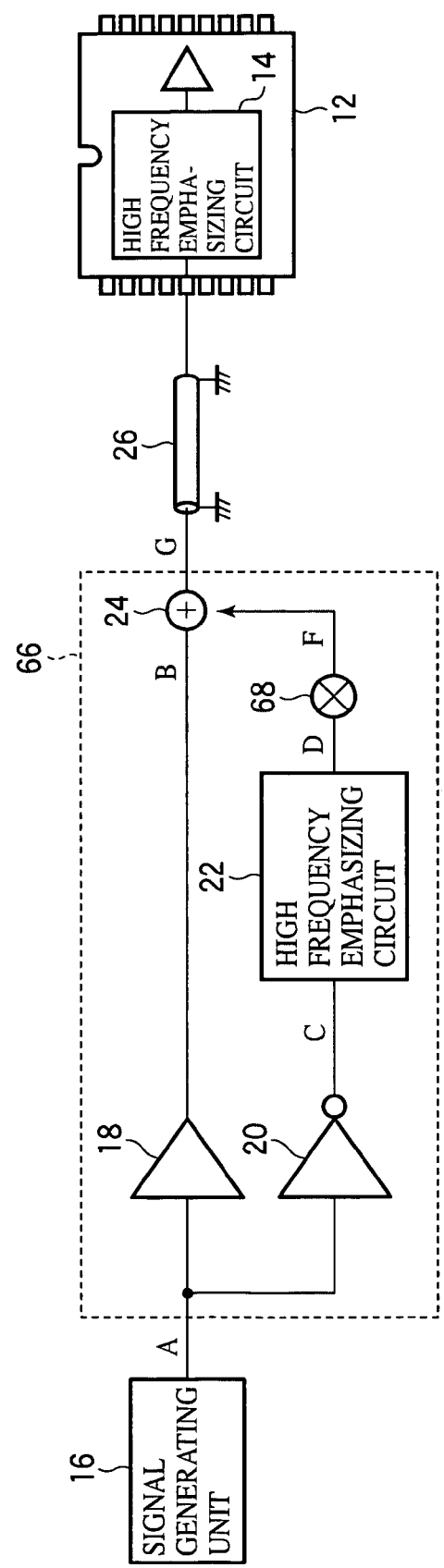
FIG. 7 is a block diagram illustrating the structure of the driver circuit according to a third embodiment of the present invention.

The driver circuit according to a third embodiment of the present invention will be explained with reference to FIGS. 7 to 10. FIG. 7 is a block diagram showing a structure of the driver circuit according to the present embodiment. FIGS. 8 and 9 show waveforms of signals at respective points of the driver circuit according to the present embodiment. FIG. 10 is a circuit diagram showing an example of circuit structure of the driver circuit according to the present embodiment. The same members of the present embodiment as those of the driver circuit according to the first and the second embodiments are represented by the same reference numbers.

The driver circuit 66 according to the present embodiment further includes a multiplication circuit 68 for correcting the amplitude of an output signal of the high frequency emphasizing circuit 22 by multiplying the output signal of the high frequency emphasizing circuit 22 with a prescribed correction value in addition to the structure of the driver circuit 10 according to the first embodiment illustrated in FIG. 3.

As illustrated in FIG. 7, the multiplication circuit 58 of the driver circuit 66 according to the present embodiment receives an input signal from the high frequency emphasizing circuit 22 and multiplies the input signal with a prescribed correction value to output a signal by correcting the amplitude of the input signal.

The addition unit 24 receives the output signal of the main driver 18 and the output signal of the multiplication circuit 68 and outputs a signal by adding the output signal of the multiplication circuit 68 to the output signal of the main driver 18.

As described above, the driver circuit 66 according to the present embodiment adds the output signal of the high frequency emphasizing circuit 22 having the amplitude corrected by the multiplication circuit 68 to the output signal of the main driver 18 to thereby generate a simulated signal simulating a signal subjected to transmission loss. At this time, in the multiplication circuit 68, the correction value for correcting the amplitude of an outputs signal of the high frequency emphasizing circuit 22 can be varied, whereby a loss of the simulated signal can be varied.

An example of operation for varying the transmission loss of the simulated signals in the driver circuit 66 according to the present embodiment will be explained with reference to FIGS. 8 and 9. FIGS. 8 and 9 show waveforms of the signals at Point A to Point D, Point F and Point G of the circuit structure illustrated in FIG. 7.

FIG. 8 illustrates the waveforms of an output signal of the high frequency emphasizing circuit 22 having the amplitude adjusted by ½ times by the multiplication circuit 66. FIG. 8A illustrates the waveforms of a signal generated by the signal generating unit 16 (the signal at Point A) and an output signal of the main driver 18 (the signal at Point B). FIG. 8B illustrates the waveform of an output signal of the sub driver 20 (the signal at Point C). FIG. 8C illustrates an output signal of the high frequency emphasizing circuit 22 (the signal at Point D). FIG. 8D illustrates the waveform of an output signal of the multiplication circuit 68 (the signal at Point F). FIG. 8E illustrates the waveform of an output signal of the addition circuit (the signal at Point G).

Figure 8A:
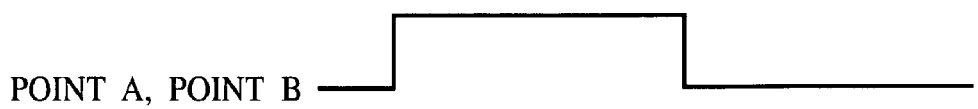
FIG. 8 is a view (Part 1) showing the waveforms of signals at respective points of the driver circuit according to the third embodiment of the present invention.
Figure 8B:
Figure 8C:

The signal generated by the signal generating unit 16, the output signal of the main driver 18, the output signal of the sub driver 20 and the output signal of the high frequency emphasizing circuit 22 are, as respectively illustrated in FIGS. 8A to 8C, the same in the waveforms as those of the driver circuit according to the first embodiment.

Figure 8D:
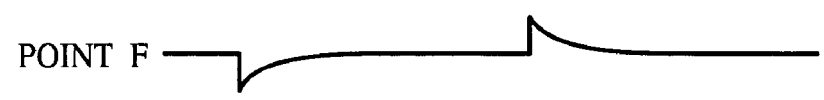

As illustrated in FIG. 8D, the output signal of the multiplication circuit 68 is a signal of the waveform given by adjusting the amplitude of the output signal of the high frequency emphasizing circuit 22 by ½.

Figure 8E:
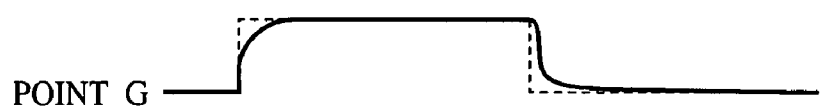

As illustrated in FIG. 8E, the output signal of the addition circuit 24 is a signal of the waveform resulted from adding the output signal of the high frequency emphasizing circuit 22 having the amplitude adjusted by ½ illustrated in FIG. 8D to the output signal of the main driver illustrated in FIG. 8A. As described above, the driver circuit 66 according to the present embodiment adds the output signal of the main driver 18 to the output signal of the high frequency emphasizing circuit 11 having the amplitude adjusted by the multiplication circuit 68 to generate a signal emphasizing the low frequency of the output signal of the main driver 18. Thus, the signal from the driver circuit 66 has a waveform whose rising edge and falling edge are blunt, i.e., a simulated signal simulating a signal having the high frequency component degraded due to transmission loss.

In the waveforms illustrated in FIG. 8, the amplitude of an output signal of the high frequency emphasizing circuit 22 to be added to the output signal of the main driver 18 is adjusted by ½ by the multiplication circuit 68. Accordingly, in this case, a loss of the simulated signal is smaller in comparison with that of the case that the output signal of the high frequency emphasizing circuit 11 without adjusting amplitude is added to the output signal of the main driver 18.

FIG. 9 illustrates the waveforms when the amplitude of an output signal of the high frequency emphasizing circuit 22 is adjusted to zero by the multiplication circuit 68. FIG. 9A is the waveform of a signal generated by the signal generating unit 16 (the signal Point A) and an output signal of the main driver 18 (the signal at Point B). FIG. 9B is the waveform of an output signal of the sub driver 20 (the signal at Point C). FIG. 9C is the waveform of an output signal of the high frequency emphasizing circuit 22 (the signal at Point D). FIG. 9D illustrates the waveform of an output signal of the multiplication circuit 68 (the signal at Point F). FIG. 9E illustrates the waveform of an output signal of the addition circuit (the signal at Point G).

Figure 9A:
FIG. 9 is a view (Part 2) showing the waveforms of signals at the respective points of the driver circuit according to the third embodiment of the present invention.
Figure 9B:
Figure 9C:
Figure 10:
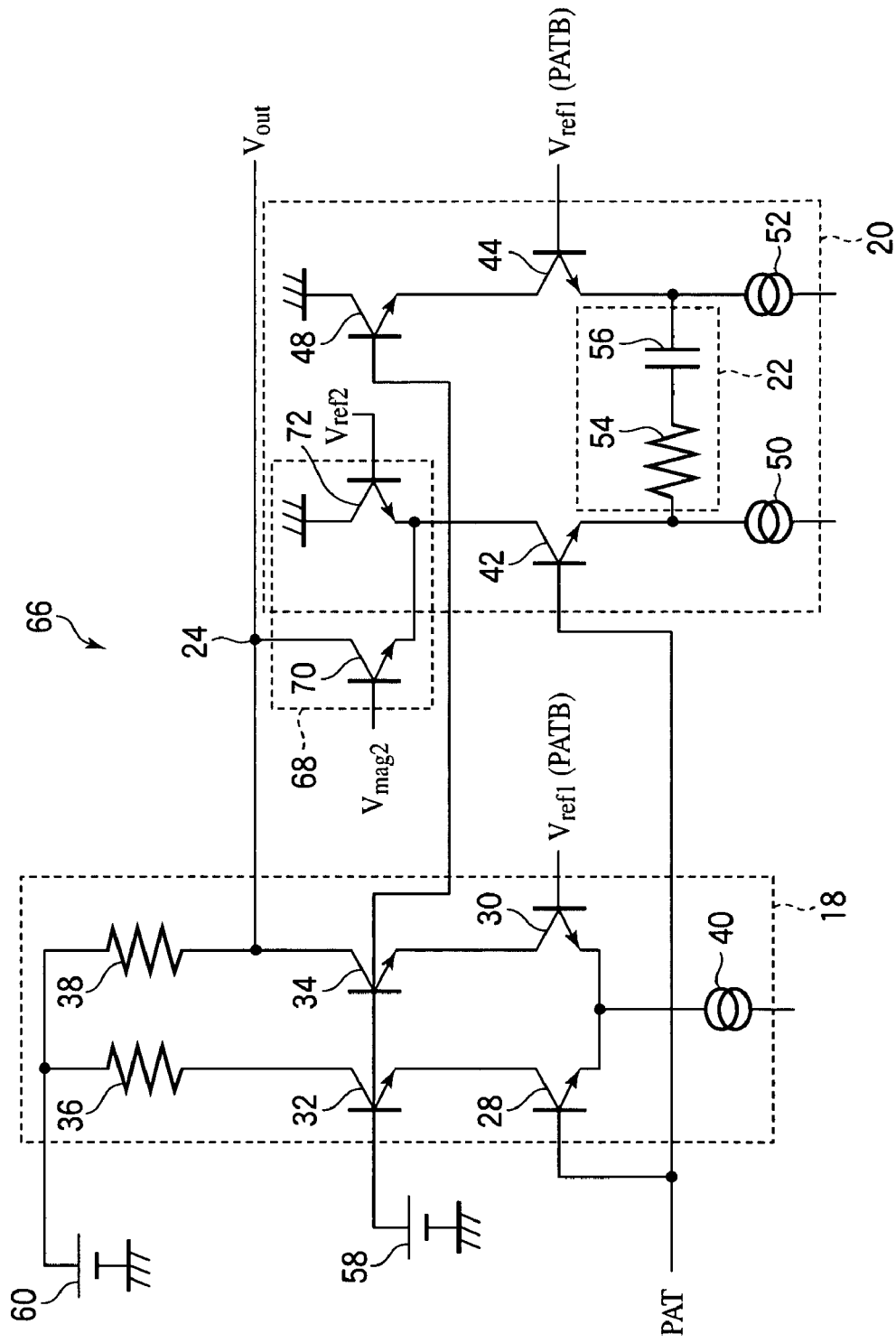
FIG. 10 is a circuit diagram illustrating an example of circuit structure of the driver circuit according to the third embodiment of the present invention.

The signal generated by the signal generating unit 16, the output signal of the main driver 18, the output signal of the sub driver 20 and the output signal of the high frequency emphasizing circuit 22 are, as respectively illustrated in FIGS. 9A to 9C, the same in the waveforms as those of the driver circuit according to the first embodiment.

Figure 9D:

As illustrated in FIG. 9D, the output signal of the multiplication circuit 68 is a signal of the waveform when the amplitude of the output signal of the high frequency emphasizing circuit 22 is adjusted to zero.

Figure 9E:

As illustrated in FIG. 9E, the output signal of the addition circuit 24 is a signal produced by adding the output signal of the high frequency emphasizing circuit 22 having the amplitude adjusted to zero as illustrated in FIG. 9D to the output signal of the main driver 18 illustrated in FIG. 9A, i.e., a signal of the same waveform as that of the output signal of the main driver 18. As described above, the driver circuit 66 according to the present embodiment adjusts the amplitude of the output signal of the high frequency emphasizing circuit 22 to zero by the multiplication circuit 68 to thereby output a signal not simulating the transmission loss.

As described above, the driver circuit 66 according to the present embodiment, the amplitude of an output signal of the high frequency circuit 22 to be added to an output signal of the main driver 18 is adjusted, whereby a loss of a simulated signal simulating a signal subjected to transmission loss can be varied.

In the above example, the amplitude of an output signal of the high frequency emphasizing circuit 22 is adjusted by ½ and 0 times. However, the amount of adjustment of the amplitude can be varied suitably depending on a loss of a simulated signal to be generated.

Then, the specific circuit structure of the driver circuit 88 according to the present embodiment will be explained with reference to FIG. 10.

The circuit structure of the main driver 18 is the same as that of first embodiment illustrated in FIG. 5.

The sub driver 20 comprises two transistors 42, 44, a transistor 58 having the emitter connected to the collector of the transistor 44, and constant current circuits 50, 52 respectively connected to the emitters of the two transistors 42, 44.

The circuit structure of the high frequency emphasizing circuit 22 is the same as that of the first embodiment illustrated in FIG. 5.

The multiplication circuit 68 comprises two transistors 70, 72 having the emitters connected to the collector of the transistor 42.

In the main driver 18, as in the first embodiment, a signal PAT generated by the signal generating unit 16 is inputted to the base of one transistor 28, and a signal of the same phase as that of the signal inputted to the base of one transistor 28 is outputted from the collector of the transistor 34 connected to the collector of the other transistor 30. This signal is outputted as an output signal of the main driver 18.

In the sub driver 20 as well, as in the first embodiment, the signal PAT generated by the signal generating unit 16 is inputted to the base of one transistor 42, and to the multiplication circuit 68 connected to the collector of the transistor 41, a signal of the inverted waveform of the signal inputted to the base of the transistor 42 having the high frequency emphasized is inputted.

In the multiplication circuit 68, to the base of one transistor 70, a signal of a prescribed voltage $V_{mag2}$ is inputted. To the base of the transistor 72, a signal of a prescribed reference voltage $V_{ref2}$ is inputted. Thus, from the collector of the transistor 70, a signal resulted from adjusting the amplitude of the signal inputted to the multiplication circuit 68 is outputted as an output signal of the multiplication circuit 68.

The output signal of the multiplication circuit 68 is added to the output signal of the main driver 18 by the addition circuit 24.

Thus, the output signal of the main driver 18 is added to the output signal of the multiplication circuit 68, whereby a signal simulating a signal subjected to transmission loss is generated as an output signal $V_{out}$ of the driver circuit 66. In the driver circuit 66 according to the present embodiment, the multiplication circuit 68 allows to vary the voltage $V_{mag2}$ of a signal inputted to the base of the transistor 70 to thereby vary a loss of a simulated signal.

As described above, according to the present embodiment, without the need of a complicated circuit structure, a simulated signal simulating a signal subjected to transmission loss can be generated and can vary a loss of the simulated signal.

Fourth Embodiment

Figure 11:
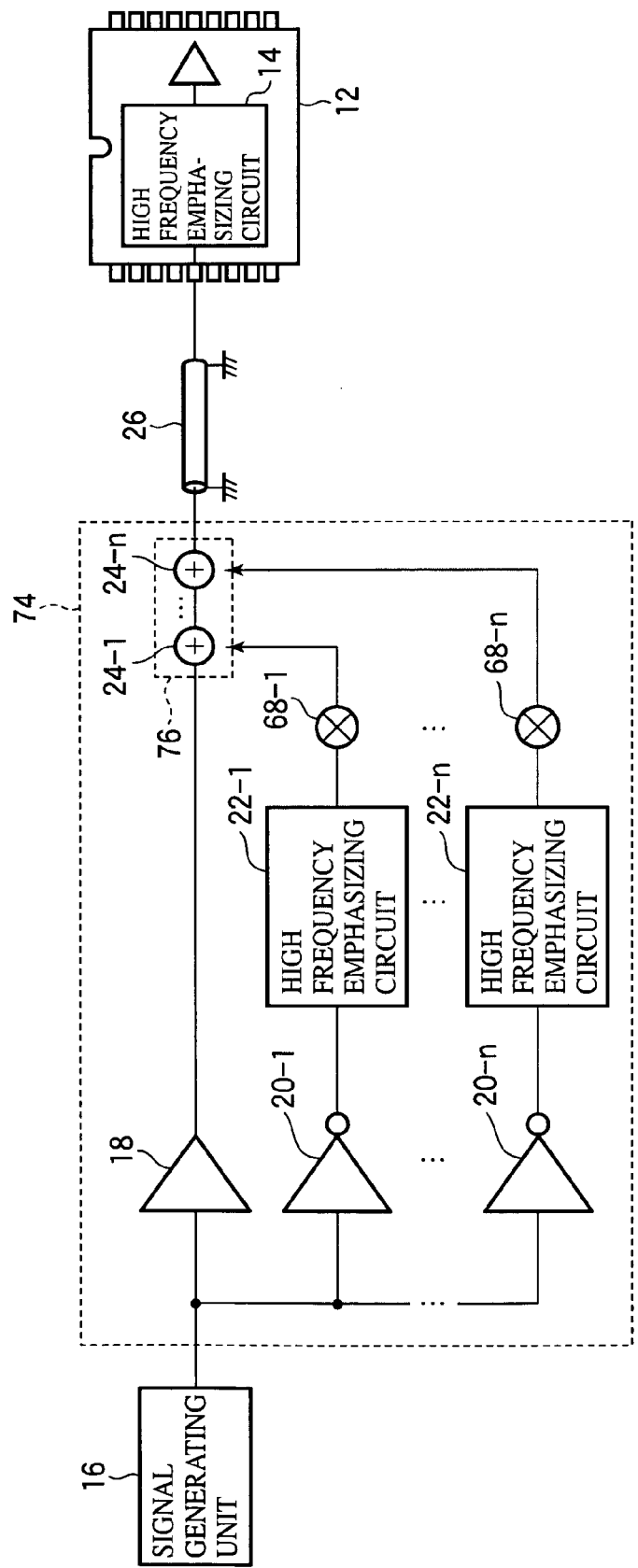
FIG. 11 is a block diagram illustrating the structure of the driver circuit according to a fourth embodiment of the present invention.
Figure 12:
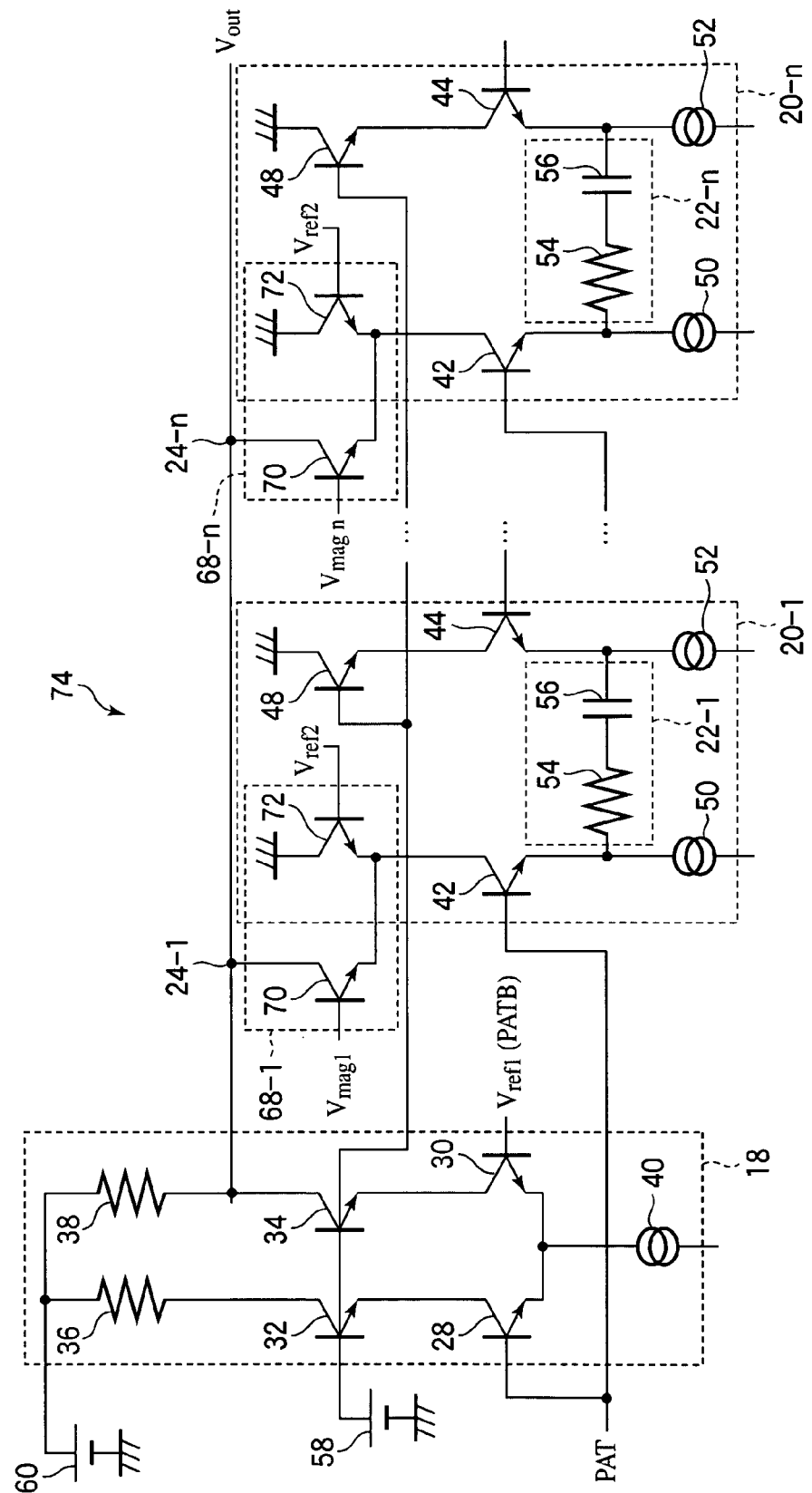
FIG. 12 is a circuit diagram illustrating an example of circuit structure of the driver circuit according to the fourth embodiment of the present invention.

The driver circuit according to a fourth embodiment of the present invention will be explained with reference to FIGS. 11 and 12. FIG. 11 is a block diagram showing a structure of the driver circuit according to the present embodiment. FIG. 12 is a circuit diagram showing an example of circuit structure of the driver circuit according to the present embodiment. The members of the driver circuit of the present embodiment as those of the driver circuit according to the first to the third embodiments are represented by the same reference numbers.

In generating a simulating a signal subjected to transmission loss, the driver circuit 74 according to the present embodiment can vary a loss of the simulated signal and can shape a waveform of the simulated signal into an arbitrary waveform.

As illustrated in FIG. 11, the driver circuit 74 according to the present embodiment comprises a main driver 18, a plurality of sub drivers 20-1, ..., 20-n (n is an integer of 2 or higher), a plurality of high frequency emphasizing circuits 22-1, ..., 22-n associated with the respective plural sub drivers 20-1, ..., 20-n, a plurality of multiplication circuits 68-1, ..., 68-n associated with the respective high frequency emphasizing circuits 22-1, ..., 22-n., and an addition unit 76.

The main driver 18 receives an input signal from the signal generating unit 16 and outputs an output signal of the same waveform as that of the input signal.

The plural sub drivers 20-1, ..., 20-n receive input signals from the signal generating unit 16 and output signals of the inverted waveform of the input signals.

The plural high frequency emphasizing circuits 22-1, ..., 22-n receive input signals from the sub drivers 20-1, ..., 20-n associated with the respective high frequency emphasizing circuits 22-1, ..., 22-n and pass the high frequency components of the input signals to output signals having the high frequencies of the input signals emphasized. Each high frequency emphasizing circuit 22-1, ..., 20-n is a highpass filter, specifically an RC differentiating circuit and outputs a differentiated signal of the output signal of the associated sub driver 20-1, ..., 20-n. The plural high frequency emphasizing circuits 22-1, ..., 22-n have time constants different from each other.

The plural multiplication circuits 68-1, ..., 68-n receive input signals from the respective high frequency emphasizing circuits 22-1, ..., 22-n and output signals having the amplitudes of the input signals adjusted by multiplying the input signals with prescribed correction values.

The addition unit 76 comprises plural addition circuits 24-1, ..., 24-n associated with the respective plural multiplication circuits 68-1, ..., 68-n.

The plural addition circuits 24-1, ..., 24-n receive output signals of the respective multiplication circuits 68-1, ..., 68-n and add the output signals of the respective multiplication circuits 68-1, ..., 68-n to the output signal of the main driver 18. Thus, the addition unit 76 outputs signals produced by adding the output signals of the plural multiplication circuits 68-1, ..., 68-n to the output signal of the main driver 18.

The output signals of the addition unit 76 are inputted to the DUT 12 via the loss-free transmission line 26.

Thus, simulated signals simulating signals subjected to transmission loss of a prescribed loss are supplied to the DUT 12, and the high frequency emphasizing circuit 14 incorporated in the DUT 12 is tested.

As described above, the driver circuit 74 according to the present embodiment comprises plural high frequency emphasizing circuits 22-1, ..., 22-n of different time constants and plural multiplication circuits 68-1, ..., 68-n for adjusting the amplitudes of the outputs signals of the plural high frequency emphasizing circuit 22-1, ..., 22-n, whereby signals having amplitudes of the output signals of the plural high frequency emphasizing circuits 22-1, ..., 22-n of different time constants adjusted by the plural multiplication circuits 68-1, ..., 68-n are added to the output signal of the main driver 18 to thereby generate a simulated signal simulating a signal subjected to transmission loss.

The plural high frequency emphasizing circuits 22-1, ..., 22-n, whose time constants are different from each other, output high frequency emphasized signals of waveforms different from each other. Thus, the output signals having waveforms different from each other from the plural high frequency emphasizing circuits 22-1, ..., 22-n are adjusted in amplitude by the multiplication circuits 68-1, ..., 68-n and then added to the output signal of the main driver 18.

Thus, in the driver circuit 74 according to the present embodiment, correction values for adjusting the amplitudes of the outputs signals of the plural high frequency emphasizing circuits 22-1, ..., 22-n whose time constants are different from each other are suitably set in the plural multiplication circuits 68-1, ..., 68-n, whereby a loss of a simulated signal simulating a signal subjected to transmission loss can be varied, and a waveform of a simulated signal can be shaped into an arbitrary waveform.

Next, the specific circuit structure of the driver circuit 74 according to the present embodiment will be explained with reference to FIG. 12.

The circuit structure of the main driver 18 is the same as that of the first embodiment illustrated in FIG. 5.

Each sub driver 20-1, ..., 20-n comprises, as the sub driver 20 of the third embodiment illustrated in FIG. 10, two transistors 42, 44, a transistor 48 having the emitter connected to the transistor 44 and a constant current circuits 50, 52 connected to the respective emitter of the transistors 42, 44.

Each high frequency emphasizing circuit 22-1, ..., 22-n is a differentiating circuit including a resistor 54 and a condenser 56 serially connected between the emitter of the transistor 42 and the emitter of the transistor 44 of the associated sub driver 20-1, ..., 20-n. The resistors 54 and the condensers 52 forming the high frequency emphasizing circuits 22-1, ..., 22-n are so selected that the high frequency emphasizing circuits 22-1, ..., 20-n have time constants different from each other.

Each multiplication circuit 68-1, ..., 68-n comprises, as the multiplication circuit 68 of the third embodiment illustrated in FIG. 10, two transistors 70, 72 having the emitters connected to the collectors of the associated sub drivers 20-1, ..., 20-n.

In the main driver 18, as in the first embodiment, a signal PAT generated by the signal generating unit 16 is inputted to the base of the transistor 28, and from the collector of the transistor 34 connected to the collector of the transistor 30, a signal of the same phase as that of the signal inputted to the base of the transistor 28 is generated. This signal is outputted as an output signal of the main driver 18.

In the sub drivers 20-1, ..., 20-n, a signal PAT generated by the signal generating unit 16 is inputted to the bases of the transistors 42, and to the multiplying (multiplication) circuits 68-1, ..., 68-n connected to the collectors of the transistors 42, a signal of the inverted waveform of the signal supplied to the bases of the transistors 42 having the high frequency emphasized are inputted. The high frequency emphasizing circuits 22-1, ..., 22-n associated with the respective sub drivers 20-1, ..., 20-n have time constants different from each other. Thus, the signals inputted to the multiplying circuits 68-1, ..., 68-n of the sub drivers 20-1, ..., 20-n are high frequency emphasized signals of waveforms different from each other. Signals from the high frequency emphasizing circuits 22-1, ..., 22-n having the sub drivers 20-1, ..., 20-n as the input sources are inputted to the associated multiplying circuits 68-1, ..., 68-n.

In the multiplying circuits 68-1, ..., 68-n, signals of prescribed voltages $V_{mag1}, ..., V_{magn}$ are inputted to the bases of the transistors 70. To the bases of the transistors 72, a signal of a prescribed reference voltage $V_{ref2}$ is inputted. Thus, from the collectors of the transistors 70, signals of adjusted amplitudes of the signals from the associated high frequency emphasizing circuits 22-1, ..., 22-n are outputted.

The output signals of the multiplying circuit 68-1, ..., 68-n are added to the output signals of the main driver 18 by the associated addition circuits 24-1, ..., 24-n.

The output signals of the multiplying circuits 68-1, ..., 68-n are added to the output signal of the main driver 18, whereby a signal simulating a signal subjected to transmission loss is generated, and is outputted as an output signal $V_{out}$ of the driver circuit 74. In the driver circuit 74 according to the present embodiment, voltages $V_{mag1}, ..., V_{magn}$ signals inputted to the bases of the transistors 70 are varied in the multiplying circuits 68-1, ..., 68-n, whereby a loss of the simulated signal can be varied, and the waveform can be shaped into an arbitrary waveform.

As described above, according to the present embodiment, without the need of a complicated circuit structure, a simulated signal simulation a signal subjected to transmission loss can be generated. Furthermore, a loss of a simulated signal can be varied, and its waveform can be shaped into an arbitrary waveform.

Fifth Embodiment

Figure 13:
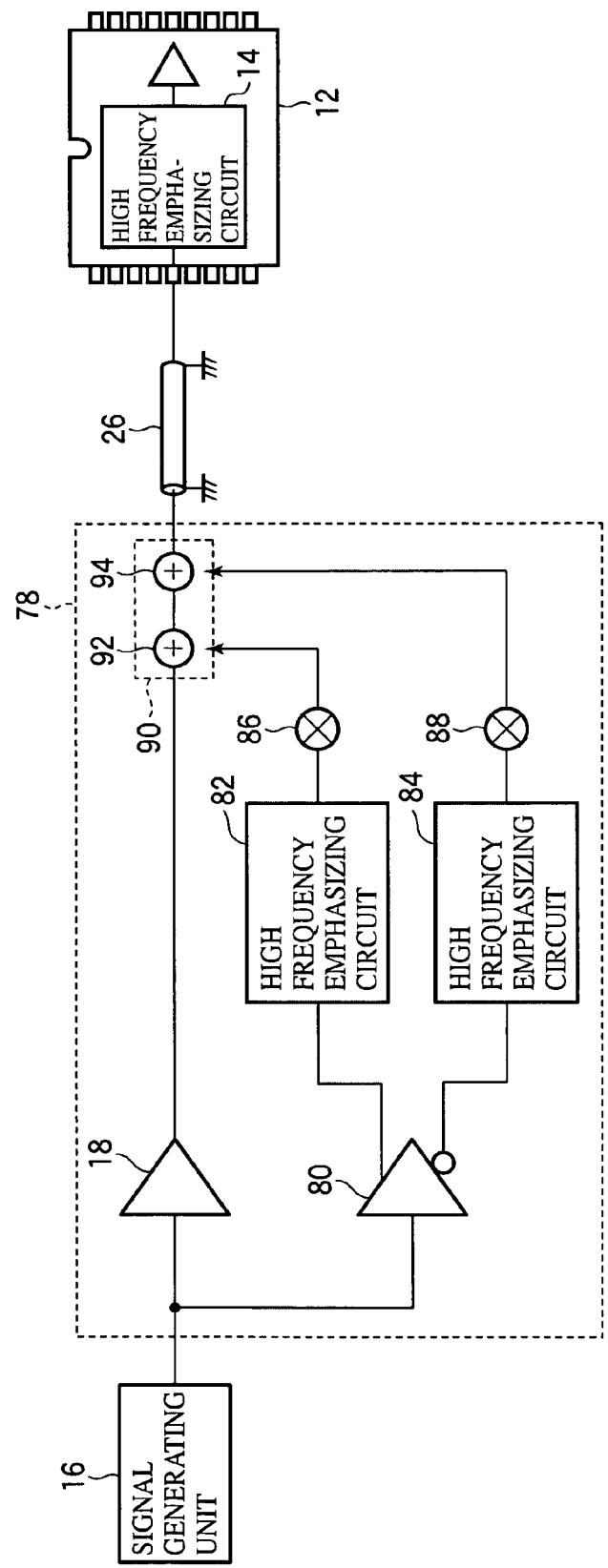
FIG. 13 is a block diagram illustrating the structure of the driver circuit according to a fifth embodiment of the present invention.
Figure 14:
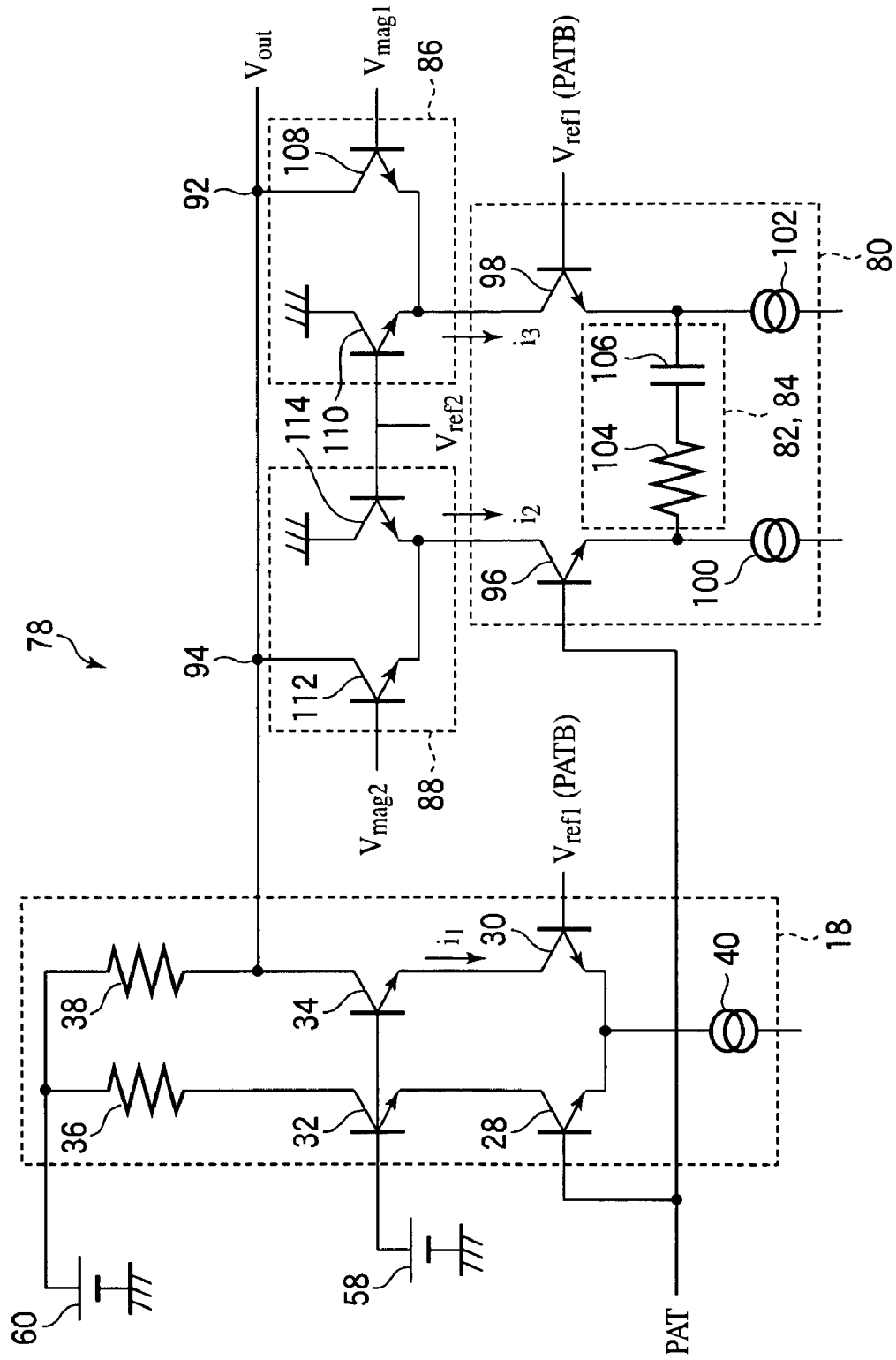
FIG. 14 is a circuit diagram illustrating an example of circuit structure of the driver circuit according to the fifth embodiment of the present invention.

The driver circuit according to a fifth embodiment of the present invention will be explained with reference to FIGS. 13 to 15. FIG. 13 is a block diagram showing a structure of the driver circuit according to the present embodiment. FIG. 14 is a circuit diagram showing an example of circuit structure of the driver circuit according to the present embodiment. FIG. 15 shows waveforms of signals at respective points of the driver circuit according to the present embodiment. The same members of the present embodiment as those of the driver circuit according to the first to the fourth embodiments are represented by the same reference numbers.

As illustrated in FIG. 13, the driver circuit 78 according to the present embodiment comprises a main driver 18, a sub driver 80, a high frequency emphasizing circuit 82, a high frequency emphasizing circuit 84, two multiplying circuits 86, 88 associated to the respective high frequency emphasizing circuit 82 and the high frequency emphasizing circuit 84, and an addition unit 90.

The main driver 18 receives an input signal from the signal generating unit 16 and outputs an output signal of the same phase as that of the input signal.

The sub driver 80 is a differential driver, and receives an input signal from the signal generating unit 16 and outputs an output signal which is a differential signal having a non-inverted signal of the input signal and an inverted signal of the input signal.

The high frequency emphasizing circuit 82 generates a signal to be added to the output signal of the main driver 18 and having the high frequency of the non-inverted signal emphasized in a high frequency emphasizing operation as an output signal of the driver circuit 78. That is, the high frequency emphasizing circuit 82 receives an input signal which is the non-inverted signal of the differential signal from the sub driver 80, passes the high frequency component of the input signal and outputs a signal having the high frequency of the input signal emphasized. The high frequency emphasizing circuit 82 is a bypass filter, specifically, an RC differentiating circuit and outputs a differential signal of the non-inverted signal from the sub driver 80.

The high frequency emphasizing circuit 84 generates a signal to be added to the output signal of the main driver 18 and having the high frequency of an inverted signal emphasized in a low frequency emphasizing operation as an output signal of the driver circuit 78. That is, the high frequency emphasizing circuit 84 receives an input signal which is the inverted signal of the differential signal from the sub driver 80, passes the high frequency component of the input signal and outputs a signal having the high frequency of the input signal emphasized. The high frequency emphasizing circuit 84 is a bypass filter, specifically an RC differentiating circuit and outputs a differential signal of the inverted signal from the sub driver 80.

The multiplying circuit 86 receives an input signal from the associated high frequency emphasizing circuit 82 and outputs an output signal in which the amplitude of the input signal is adjusted by multiplying the input signal with a prescribed correction value.

The multiplying circuit 88 receives an input signal from the associated high frequency emphasizing circuit 84 and outputs an output signal in which the amplitude of the input signal is adjusted by multiplying the input signal with a prescribed correction value.

The addition unit 90 includes an addition circuits 92, 94 associated with the respective two multiplying circuits 86, 88.

The addition circuit 92, in the high frequency emphasizing operation, receives an output signal of the main driver 18 and an output signal of the multiplying circuit 86 and outputs a signal by adding the output signal of the high frequency emphasizing circuit 82 having the amplitude adjusted by the multiplying circuit 86 to the output signal of the main driver 18.

The addition circuit 94 receives, in the low frequency emphasizing operation, an output signal of the main driver 18 and an output signal of the associated multiplying circuit 88 and outputs a signal by adding the output signal of the high frequency emphasizing circuit 84 having the amplitude adjusted by the multiplying circuit 88 to the output signal of the main driver 18.

Thus, the addition unit 90 outputs an output signal of the addition circuit 92 as an output signal in a high frequency emphasizing operation and outputs an output signal of the addition circuit 94 as an outputs signal in a low frequency emphasizing operation.

An output signal of the addition unit 90 inputs to a DUT 12 via the loss-free transmission line 26, and the high frequency emphasizing circuit 14, etc. incorporated in the DUT can be tested.

The driver circuit 78 according to the present embodiment selectively makes the high frequency emphasizing operation of outputting a high frequency emphasized signal and the low frequency emphasizing operation of outputting a low frequency emphasized signal. In the high frequency emphasizing operation, the driver circuit 78 outputs the high frequency emphasized signal by adding the output signal of the high frequency emphasizing circuit 82 having the amplitude adjusted by the multiplication circuit 86 to the output signal of the main driver 18. In the low frequency emphasizing operation, the driver circuit 78 outputs the low frequency emphasized signal by adding the output signal of the high frequency emphasized circuit 84 having the amplitude adjusted by the multiplication circuit 88 to the output signal of the main driver 18. The driver circuit 78 according to the present embodiment generates, in the low frequency emphasizing operation, a signal having the low frequency emphasized, i.e., a simulated signal simulating a signal subjected to transmission loss as the driver circuit according to the third embodiment.

As will be described below, the driver circuit 78 according to the present embodiment uses a common resistor and a capacitor for forming the high frequency emphasizing circuit 82 and the high frequency emphasizing circuit 84 and additionally includes a small circuit to the specific circuit structure of the driver circuit according to the third embodiment illustrated in FIG. 10. Thus, the driver circuit 78 according to the present embodiment realizes the low frequency emphasis and the high frequency emphasis of signals by the high frequency emphasizing circuit 82 and the high frequency emphasizing circuit 84 without the need of a complicated circuit structure.

The specification of U.S. patent application Ser. No. 11/262,507 describes a high frequency emphasizing circuit which corresponds to the circuit portion containing the high frequency emphasizing circuit 82 for realizing the high frequency emphasis. By adding the small circuit to this high frequency emphasizing circuit, the driver circuit 78 according to the present embodiment which realizes the low frequency emphasis and the high frequency emphasis can be constituted.

Next, the specific circuit structure of the driver circuit 78 according to the present embodiment will be explained with reference to FIGS. 14 and 15.

The circuit structure of the main driver 18 is the same as that of the first embodiment illustrated in FIG. 5.

The sub driver 80 comprises two transistors 96, 98 and constant current circuits 100, 102 connected to the emitters of the respective two transistors 96, 98.

The high frequency emphasizing circuit 82 and the high frequency emphasizing circuit 84 are commonly established by a differentiating circuit comprising a resistor 104 and a condenser 106 serially connected between the emitter of the transistor 96 and the emitter of the transistor 98 in the sub driver 80.

The multiplying circuit 86 comprises two transistors 108, 110 having the emitters connected to the collector of the transistor 98 of the sub driver 80. The multiplying circuit 88 comprises two transistors 112, 114 having the emitters connected to the collector of the transistor 96 of the sub driver 80.

In the circuit structure of the driver circuit 78 according to the present embodiment described above, the transistors 96, 98 of the sub driver 80 respectively correspond to the transistors of the driver circuit 66 according to the third embodiment illustrated in FIG. 10. The constant current circuits 50, 52 respectively correspond to the constant current circuits 50, 52 of the driver circuit 66 according to the third embodiment illustrated in FIG. 10. The resistor 104 and the condenser 106 forming the high frequency emphasizing circuit 82 and the high frequency emphasizing circuit 84 respectively correspond to the resistor 54 and the condenser 56 forming the high frequency emphasizing circuit 22 of the driver circuit 66 according to the third embodiment illustrated in FIG. 10. The transistors 112, 113 of the multiplying circuit 88 respectively correspond to the transistors 70, 72 of the multiplying circuit 68 of the driver circuit 66 according to the third embodiment illustrated in FIG. 10. Thus, the driver circuit 78 according to the present embodiment can be constituted by merely adding the multiplying circuit 86 to the driver circuit 66 according to the third embodiment illustrated in FIG. 10.

Figure 15A:
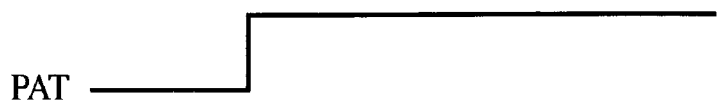
FIG. 15 shows the waveforms of signals at respective points of the specific circuit structure of the driver circuit according to the fifth embodiment of the present invention.
Figure 15B:

In the main driver 18, a signal PAT generated by the signal generating unit 16 is inputted to the base of transistor 28. FIG. 15A illustrates the waveform of a signal (voltage) PAT inputted by the signal generating unit 16. To the base of the transistor 30, a signal of a prescribed reference voltage $V_{ref1}$ (PATB) is inputted. Thus, from the collector of the transistor 34 connected to the collector of the transistor 30, a signal of the same phase as that of the signal at the base of the transistor 28 is outputted. FIG. 15B illustrates the waveform of a signal (current) $i_1$ flowing from the emitter of the transistor 34 to the collector of the transistor 30. The signal from the collector of the transistor 30 is outputted as an output signal of the main driver 18 via the transistor 34.

In the sub driver 80, as in the main driver 18, the signal PAT generated by the signal generating unit 16 is inputted to the base of one transistor 96. To the base of the other transistor 98, the signal of the prescribed reference voltage $V_{ref1}$ (PATB) is inputted.

Figure 15C:

Thus, to the multiplying circuit 88 connected to the collector of the transistor 96, a signal of the inverted waveform of the signal at the base of the transistor 96 is inputted. Here, a signal from the collector of the transistor 96 has the high frequency emphasized by the high frequency emphasizing circuit 84 formed in the differentiating circuit of the resistor 104 and the condenser 106, and thus only the high frequency component higher than a cutoff frequency determined by by the time constant of the differentiating circuit is outputted. FIG. 15C illustrates the waveform of a signal (current) $i_2$ flowing at this time from the emitter of the transistor 112 to the collector of the transistor 96.

The signal outputted from the collector of the transistor 96 is inputted to the multiplying circuit 88.

Figure 15D:

From the collector of the transistor 98, a signal of the same waveform as that of the signal inputted to the base of one transistor 86 is generated. Here, a signal from the collector of the transistor 98 has the high frequency emphasized by the high frequency emphasizing circuit 82 formed in the differentiating circuit of the resistor 104 and the condenser 106, and thus only the high frequency component higher than the cutoff frequency determined by by the time constant of the differentiating circuit is outputted. FIG. 15D illustrates the waveform of a signal (current) $i_3$ flowing at this time from the emitter of the transistor 108 to the collector of the transistor 98.

The signal outputted from the collector of the transistor 98 is inputted to the multiplying circuit 86.

In the multiplying circuit 86, the signal the collector of the transistor 98 is inputted to the emitters of the transistor 108 and the transistor 110. Here, to the base of the transistor 108, a signal of a prescribed voltage $V_{mag1}$ is inputted. To the base of the transistor 110, a signal of a prescribed reference voltage $V_{ref2}$ is inputted. Thus, from the collector of the other transistor 108, a signal of an adjusted amplitude of the signal from the collector 98 is outputted.

The signal outputted from the collector of the transistor 108 of the multiplying circuit 86 is added to the output signal of the main driver 18 by the addition circuit 92.

In the multiplying circuit 88, the signal from the collector of the transistor 96 is inputted to the emitters of the transistor 112 and the transistor 114. Here, to the base of the transistor 112, a signal of a prescribed voltage $V_{mag2}$ is inputted. To the base of the transistor 14, a signal of a prescribed reference voltage $V_{ref2}$ is inputted. Thus, from the collector of the transistor 112, a signal of an adjusted amplitude of the signal from the collector of the transistor 96 is outputted.

The signal outputted from the collector of the transistor 112 of the multiplying circuit 88 is added to the output signal of the main driver 18 by the addition circuit 94.

Figure 15E:
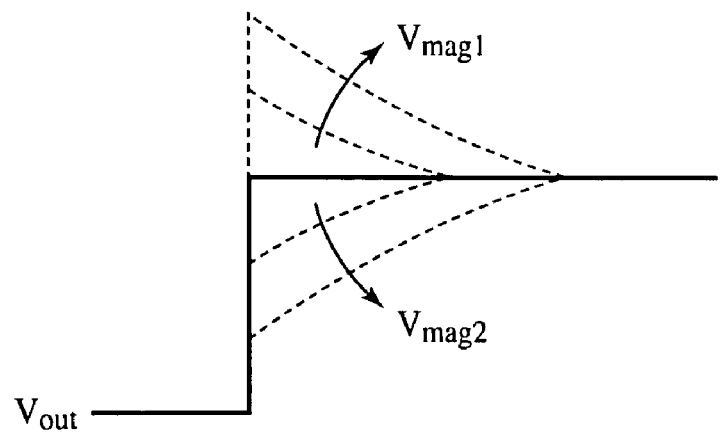

In the high frequency emphasizing operation of outputting a high frequency emphasized signal from the driver circuit 78, a signal outputted from the emitter of the transistor 96 is adjusted to the zero amplitude by the multiplication circuit 88, to add the output signal alone of the multiplication circuit 86 to the output signal of the main driver 18. FIG. 15E illustrates the waveform of an output signal (voltage) $V_{out}$ of the driver circuit 78. As illustrated, in the multiplication circuit 86, the voltage $V_{mag1}$ at the base of the transistor 108 is varied, whereby an emphasis magnitude of a high frequency emphasized signal can be varied.

In the low frequency emphasizing operation of outputting a low frequency emphasized signal from the driver circuit 78, a signal outputted from the emitter of the transistor 98 is adjusted to the zero amplitude by the multiplication circuit 86, and only the output of the multiplication circuit 88 is added to the output signal of the main driver 18. As illustrated in FIG. 15C, a voltage $V_{mag2}$ at the base of the transistor 112 is varied, whereby an emphasis magnitude of a low frequency emphasized signal can be varied.

Sixth Embodiment

Figure 16:
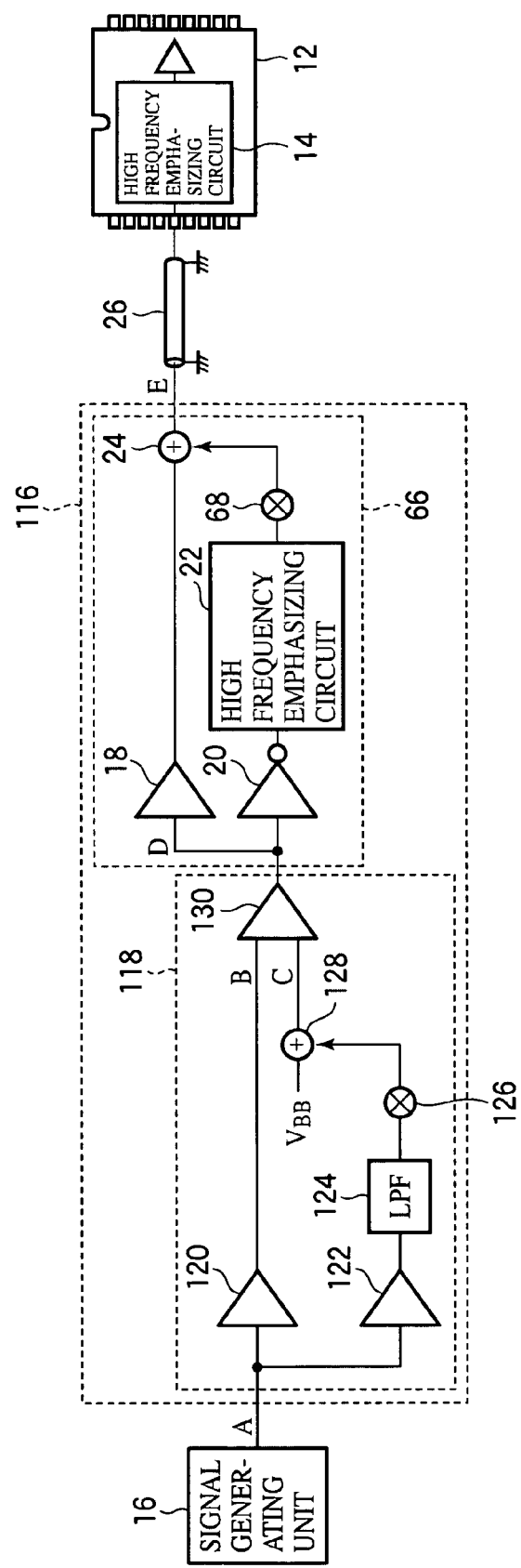
FIG. 16 is a block diagram illustrating the structure of the driver circuit according to a sixth embodiment of the present invention.

The driver circuit according to a sixth embodiment of the present invention will be explained with reference to FIGS. 16 and 17. FIG. 16 is a block diagram showing a structure of the driver circuit according to the present embodiment. FIG. 17 shows the waveforms of signals at respective points of the driver circuit according to the present embodiment. The members of the present embodiment as those of the driver circuit according to the first to the fifth embodiments are represented by the same reference numbers.

The driver circuit 116 according to the present embodiment comprises, in addition to the structure of the driver circuit according to the third embodiment illustrated in FIG. 7, a phase modulation circuit 118 for modulating a phase of a signal inputted to the driver circuit 66 to modulate a phase of a simulated signal simulating a signal subjected to transmission loss to be supplied to a DUT 12 corresponding to its amount of loss. The phase modulation circuit 118 to be combined with the driver circuit 66 in the present embodiment is detailed in the specification of Japanese Patent Application No. 2005-160832 filed by the applicant of the present invention.

As illustrated in FIG. 16, at the input terminal of the driver circuit 66, a phase modulation circuit 118 for outputting a signal of a modulated phase of a signal generated by the signal generating unit 16 is provided.

The phase modulation circuit 118 comprises drivers 120, 122, a low-pass filter (LPF) 124, a multiplication circuit 126, an addition circuit 128 and a comparator 130.

The driver 120 receives an input signal from the signal generating unit 16 and outputs an output signal of the same waveform as that of the input signal. Similarly, the driver 122 receives an input signal from the signal generating unit 16 and outputs an output signal of the same waveform as that of the input signal.

The LPF 124 receives an input signal from the driver 122 and outputs a low frequency component of the input signal.

The multiplication circuit 126 receives an input signal from the LPF 124 and outputs a signal having the amplitude of the input signal adjusted by multiplying a prescribed correction value.

The addition circuit 128 receives an output signal of the multiplication circuit 126 and a signal of a prescribed voltage $V_{BB}$ and outputs a signal given adding the output signal of the multiplication circuit 126 to the signal of the prescribed voltage $V_{BB}$. As a voltage $V_{BB}$, for example, an average voltage (50% voltage) of a low level and a high level of the input signals is used.

The comparator 130 receives at the plus input terminal an output signal of the driver 120 as an input signal and at the minus input terminal an output signal of the addition circuit 128 as a reference signal, and outputs as an output signal a signal having the phase of the input signal modulated corresponding to a frequency of the input signal.

Thus, a signal having the phase modulated by the phase modulation circuit 118 is inputted as an input signal to the main driver 18 and the sub driver 20 of the driver circuit 66, and a simulated signal simulating a signal subjected to transmission loss is generated as in the third embodiment.

As described above, in the driver circuit 116 according to the present embodiment, a phase of an input signal to be inputted to the man main driver 18 and the sub driver 20 of the driver circuit 66 is modulated by the phase modulation circuit 118, whereby a phase of a simulated signal simulating transmission loss can be modulated corresponding to an mount of loss of the transmission loss.

Thus, as in FIG. 17, for example, a timing of 50% of a rise and fall amplitude of a waveform of a simulated signal to be supplied to the DUT 12 and a timing of 50% of a rise and fall amplitude of a waveform of a signal generated by the signal generating unit 16 can be matched.

Figure 17A:
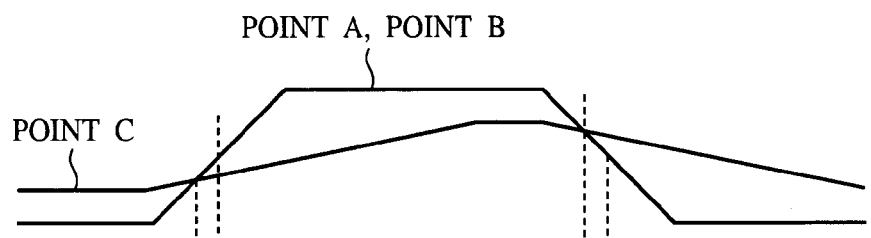
FIG. 17 shows the waveforms of signals at respective points of the driver circuit according to the sixth embodiment of the present invention.
Figure 17B:
Figure 17C:

FIG. 17 is a diagram showing waveforms of signals at Point A to Point E of the structure illustrated in FIG. 16. FIG. 17A illustrates the waveform of a signal generated by the signal generating unit 16 (a signal at Point A), the waveform of an output signal of the driver 120 (a signal at Point B) and the waveform of an output signal of the addition circuit 128 (a signal at Point C). FIG. 17B illustrates the waveform of an output signal of the comparator 130, i.e., a signal inputted to the main driver 18 and the sub driver 20 (a signal at Point D). FIG. 17C illustrates the waveform of a signal supplied to the DUT 12 (a signal at Point E). In FIG. 17C, the phase modulated signals are indicated by the solid lines, and the signal which are not phase modulated are indicated by the dotted lines.

As illustrated in FIG. 17A, the output signal of the driver 120 is a signal of the same waveform as that of a signal generated by the signal generating unit 16.

As illustrated in FIG. 17A, the output signal of the addition circuit 128 is a signal of a waveform given by adding an output signal of LPF 124 having the amplitude adjusted by the multiplication circuit 126 and a signal of a prescribed voltage value $V_{BB}$.

As illustrated in FIG. 17B, the output signal of the comparator 130 is a signal having the phase delayed with respect to the signal generated by the signal generating unit 16. Here, the correction value for adjusting the amplitude of the output signal of the LPF 124 by the multiplication circuit 126 is suitably varied, whereby the modulation magnitude of the phase can be varied.

As illustrated in FIG. 17C, the signal to be supplied to the DUT 12, i.e., the output signal of the driver circuit 66 is a signal simulating a signal subjected to transmission loss. In the driver circuit 116 according to the present embodiment, to generate a simulated signal simulating a signal subjected to transmission loss, a phase of a signal to be inputted to the main diver 18 and the sub driver 20 is modulated by the phase modulation circuit 118, whereby the timing of 50% of a rise and fall amplitude of a simulated signal can be matched with a timing of 50% of a rise and fall amplitude of a signal generated by the signal generating unit 16.

As described above, according to the present embodiment, the phase modulation circuit 118 for modulating a phase of a signal to the main driver 18 and the sub driver 20 is provided, whereby a phase of a simulated signal simulating a signal subjected to transmission loss, which is supplied to the DUT 12 can be modulated corresponding to an mount of loss of the transmission loss.

Seventh Embodiment

Figure 18:
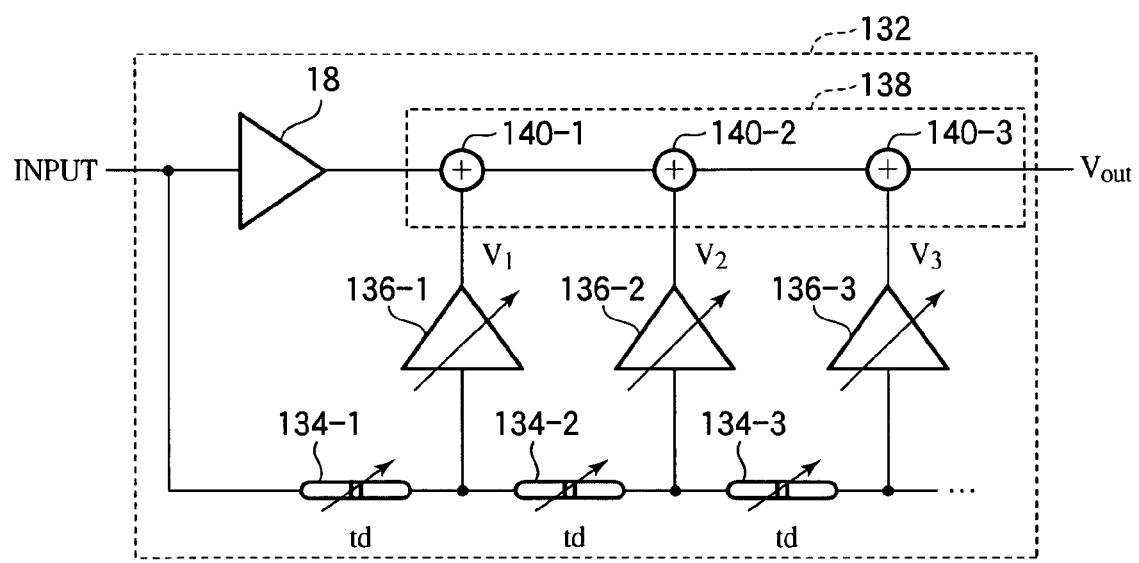
FIG. 18 is a block diagram illustrating the structure of the driver circuit according to a seventh embodiment of the present invention.

The driver circuit according to a seventh embodiment of the present invention will be explained with reference to FIGS. 18 and 19. FIG. 18 is a block diagram showing a structure of the driver circuit according to the present embodiment. FIG. 19 shows waveforms of signals at respective points in the driver circuit according to the present embodiment. The same members of the present embodiment as those of the driver circuit according to the first to the sixth embodiments are represented by the same reference numbers.

In the driver circuit 132 according to the present embodiment, plural variable delay circuits 134-1, 134-2, 134-3, . . . and plural sub-divers 136-1, 136-2, 136-3, . . . are combined, whereby a low frequency emphasized signal, i.e., a simulated signal simulating a signal subjected to transmission loss is digitally generated.

As illustrated in FIG. 18, the driver circuit according to the present embodiment comprises a main driver 18, plural variable delay circuits 134-1, 134-2, 134-3, . . . , plural sub-drivers 136-1, 136-2, 136-3, . . . associated with the respective plural variable delay circuits 134-1, 134-2, 134-3, . . . , and an addition unit 138.

To the driver circuit 132 according to the present embodiment, a signal generated by a signal generating unit (not illustrated) is inputted.

The main driver 18 receives an input signal from the signal generating unit and outputs an output signal of the same waveform as that of the input signal.

The plural variable delay circuits 134-1, 134-2, 134-3, . . . receive input signals from the signal generating unit and delay the input signals sequentially by a delay time td. The n-th (n is a positive integer) variable delay circuit 134-n outputs an output signal delayed from the input signal by a delay time n×td.

The plural sub drivers 136-1, 136-2, 136-3, . . . receive input signals from the respective plural variable delay circuits 134-1, 134-2, 134-3, . . . and output output signals having the amplitudes of the input signals adjusted. The n-th (n is a positive integer) sub driver outputs an output signal of an amplitude delayed by an n×td.

The addition unit 138 comprises plural addition circuits 140-1, 140-2, 140-3, . . . associated with the respective plural sub drivers 136-1, 136-2, 136-3, . . . .

The plural addition circuits 140-1, 14-2, 140-3, . . . add the output signals of the respective plural sub drivers 136-1, 136-2, 136-3, . . . to the output signal of the main driver 18. Thus, the addition unit 138 outputs a signal by adding the output signals of the plural sub drivers 136-1, 136-2, 136-3, . . . to the output signal of the main driver 18.

Thus, the driver circuit 132 according to the present embodiment outputs the signal by adding the output signals of the plural sub drivers 136-1, 136-2, 136-3, . . . to the output signal of the main driver 18.

FIG. 19 is a diagram showing waveforms at respective points of the structure illustrated in FIG. 18. In FIG. 19, the waveforms are directed to the situation where three variable delay circuits, three sub drivers and three addition circuits are provided. FIG. 19A illustrates a waveform of an input signal inputted to the driver circuit 132 according to the present embodiment. FIG. 19B illustrates a waveform of an output signal $V_1$ of the sub driver 136-1. FIG. 19C illustrates a waveform of an output signal $V_2$ of the sub driver 136-2. FIG. 19D illustrates a waveform of an output signal $V_3$ of the sub driver 136-3. FIG. 19E illustrates a waveform of an output signal $V_{out}$ of the driver circuit 132 according to the present embodiment.

The input signal illustrated in FIG. 19A is supplied to the main driver 18 and the plural variable delay circuits 136-1, 136-2, 136-3, . . . .

An output signal of the main driver 18 is a signal of the same waveform as that of an input signal illustrated in FIG. 19A.

As illustrated in FIG. 19B, an output signal $V_1$ of the sub driver 136-1 is a signal delayed with respect to an input signal illustrated in FIG. 19A by a delay time td and having a waveform having the amplitude adjusted.

As illustrated in FIG. 19C, an output signal $V_2$ of the sub driver 136-3 is an input signal delayed with respect to an input signal illustrated in FIG. 19A by a delay time 2×td and having a waveform having the amplitude adjusted.

As illustrated in FIG. 19D, an output signal $V_3$ of the sub driver 136-3 is a signal delay with respect to an input signal illustrated in FIG. 19A by a delay time 3×td and having a waveform having the amplitude adjusted.

As illustrated in FIG. 19E, an output signal $V_{out}$ of the driver circuit 132 according to the present embodiment is a signal of a waveform produced by adding the output signals $V_1, V_2, V_3$ of the plural sub drivers 136-1, 136-2, 136-3, to the output signal of the main driver 18.

As illustrated in FIG. 19E, $V_1$, delayed by a delay time td, $V_2$ delayed by a delay time 2×td and $V_3$ delayed by a delay time 3×td are added to an output signal of the main driver 18, whereby a low frequency emphasized signal $V_{out}$, i.e., a simulated signal $V_{out}$ simulating a signal subjected to transmission loss can be digitally generated.

As described above, the driver circuit 132 according to the present embodiment adds plural signals sequentially delayed by the plural variable delay circuits 134-1, 134-1, 134-3, . . . to an output signal of the main driver 18, whereby a low frequency emphasized signal can be digitally generated.

In the driver circuit 132 according to the present embodiment, delay times td resulted from the plural variable delay circuits 134-1, 134-2, 134-3, . . . are suitably varied, and adjustment magnitudes of amplitudes produced by the plural sub drivers 136-1, 136-2, 136-3, . . . are suitably varied, whereby emphasis magnitudes of the low frequency emphasized signals digitally generated can be varied, and their waveforms can be shaped into arbitrary waveforms.

The numbers of the plural variable delay circuits 134-1, 134-2, 134-3, . . . , the plural sub drivers 136-1, 136-2, 136-3, . . . and the plural addition circuits 140-1, 140-2, 140-3, . . . can be suitably set in accordance with resolution, etc. necessary for an output signal.

Eighth Embodiment

The driver circuit according to an eighth embodiment of the preset invention will be explained with reference to FIG. 20 which is a block diagram showing a structure of the driver according to the present embodiment. FIGS. 21 and 22 show waveforms of signals at respective points in the driver circuit according to the present embodiment. FIG. 23 is a block diagram showing an example of circuit structure of the driver circuit according to the present embodiment. FIG. 24 shows waveforms of signals at the respective points of the specific circuit diagram in the driver circuit according to the present embodiment. The same members of the present embodiment as those of the driver circuit according to the seventh embodiment are represented by the same reference numbers.

The driver circuit 142 according to the present embodiment combines the plural variable delay circuits 134-1, 134-2, 134-3, . . . and the plural sub drivers (differential drivers) 144-1, 144-2, 144-3, . . . , whereby in a low frequency, emphasizing operation, a low frequency emphasized signal i.e., a simulated signal simulating a signal subjected to transmission loss is digitally generated, and in a high frequency emphasizing operation, a high frequency emphasized signal is digitally generated.

Figure 20:
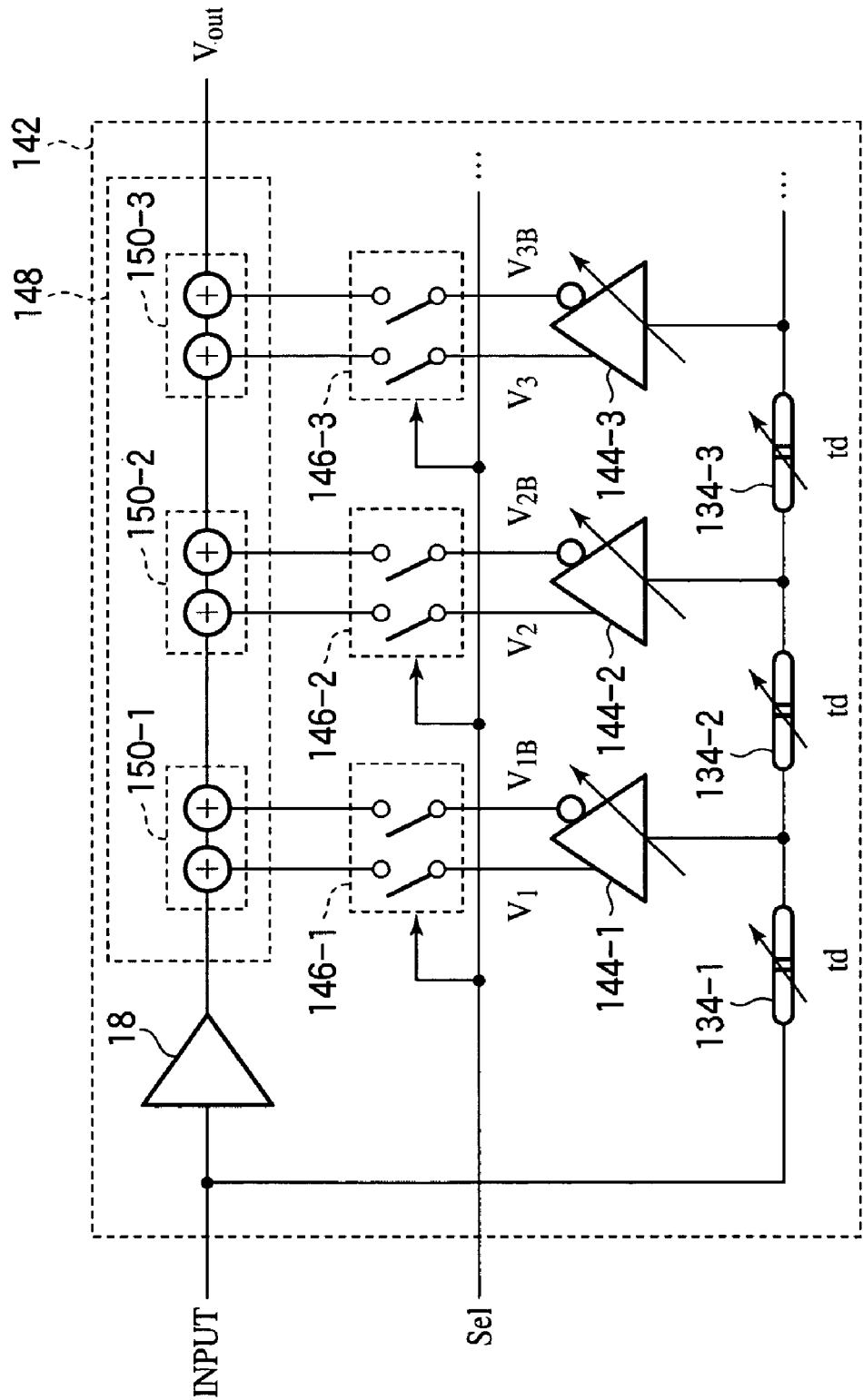
FIG. 20 is a block diagram illustrating the structure of the driver circuit according to an eighth embodiment of the present invention.

As illustrated in FIG. 20, the driver circuit 142 according to the present embodiment comprises a main driver 18, plural variable delay circuits 134-1, 134-2, 134-3, . . . , plural sub drivers 144-1, 144-2, 144-3, . . . associated with the respective plural variable delay circuits 134-1, 134-2, 134-3, . . . , plural select switches 146-1, 146-2, 146-3, . . . associated with the respective plural sub drivers 144-1, 144-2, 144-3, . . . , and an addition unit 148.

To the driver circuit 142 according to the present embodiment, a signal generated by the signal generating unit (not illustrated) is inputted.

The main driver 18 receives an input signal from the signal generating unit and produces an output signal of the same waveform as that of the input signal.

The plural variable delay circuit 134-1, 134-2, 134-3, . . . , as in the driver circuit according to the seventh embodiment, receive input signals from the signal generating unit and delay the input signal sequentially by a delay time td. The n-th (n is a positive integer) variable delay circuit 134-n outputs an output signal which is delayed from the input signal by a delay time n×td.

The plural sub-drives 144-1, 144-2, 144-3, . . . are differential drivers, and receive input signals from the respective plural variable delay circuits 134-1, 134-2, 134-3, . . . and output differential signals formed of non-inverted signals having the same waveforms as those of the input signals with adjusted amplitude, and inverted signals having inverted waveforms of the inputs signals with adjusted amplitude. The n-th (n is a positive integer) sub driver 136-n outputs a non-inverted signal and an inverted signal with adjusted amplitudes and delayed by a delay time n×td.

The plural select switches 146-1, 146-2, 146-3, . . . change connections based on the select signals Sel for switching between the low frequency emphasizing operation and the high frequency emphasizing operation for selecting the differential signals from the respective plural sub drivers 144-1, 144-2, 144-3, . . . to be inputted to the addition unit 148

That is, in the low frequency emphasizing operation, the plural select switches 146-1, 146-2, 146-3, . . . switch the connections so that the non-inverted signals of differential signals from the respective plural sub-drives 144-1, 144-2, 144-3, ... are supplied to the addition unit 148.

In the high frequency emphasizing operation, the plural select switches 146-1, 146-2, 146-3, ... switch the connections so that the inverted signals of differential signals from the respective associated plural sub drivers 144-1, 144-2, 144-3, ... are supplied to the addition unit 148.

The addition unit 148 includes a plural addition circuit 150-1, 150-2, 15-3, ... associated with the respective plural sub drivers 144-1, 144-2, 144-3, ....

The plural addition circuits 150-1, 150-2, 150-3, ... add the output signal of the main driver to the selected differential signals from the respective associated plural sub drivers 144-1, 144-2, 144-3, ..., which are provided to the addition unit 148 via the plural select switches 146-1, 146-2, 146-3, ....

That is, in the low frequency emphasizing operation, the plural addition circuits 150-1, 150-2, 150-3, ... add the output signal of the man diver 18 to the non-inverted signals from the respective plural sub-drives 144-1, 144-2, 144-3, .... Thus, the addition unit 148 outputs signals by adding the non-inverted signals from the plural sub-divers 144-1, 144-2, 144-3, ... to the output signal of the main driver 18.

In the high frequency emphasizing operation, the plural addition circuits 150-1, 150-2, 150-3, ... add the output signal of the main driver 18 to the inverted signals from the respective plural sub drivers 144-1, 144-2, 144-3, .... Thus, the addition unit 148 outputs a signal by adding the inverted signals from the plural sub drivers 144-1, 144-2, 144-3, ... to the output signal of the main driver 18.

Thus, the driver circuit 142 according to the present embodiment, in the low frequency emphasizing operation, the non-inverted signals of differential signals outputted from the plural sub drivers 144-1, 144-2, 144-3, ... are added to the output signal of the main driver 18.

The driver circuit according to the present embodiment, in the high frequency emphasizing operation, outputs a signal by adding the non-inverted signals from the plural sub drivers 144-1, 144-2, 144-3, ... to the output signal of the main driver 18.

FIG. 21 is a diagram showing waveforms of signals at respective points of the structure illustrated n FIG. 20 in the low frequency emphasizing operation. FIG. 21 is directed to the situation where three variable delay circuits, two sub drivers and three addition circuits are provided. FIG. 21A illustrate the waveform of an input signal to the driver circuit 142. FIG. 21B illustrates the waveform of a non-inverted signal $V_1$ from the sub drivers 144-1. FIG. 21C illustrates the waveform of a non-inverted signal $V_2$ from the sub driver 144-2. FIG. 21D illustrates the waveform of a non-inverted signal $V_3$ from the sub driver 144-3. FIG. 21E illustrates the waveform of an output signal of the driver circuit 142 according to the present embodiment.

The input signal illustrated in FIG. 21A is supplied to the main driver 18 and the plural variable delay circuits 134-1, 134-2, 134-3.

The output signal of the main driver 18 is a signal of the same waveform as that of the input signal illustrated in FIG. 21A.

As illustrated in FIG. 21B, the non-inverted signal $V_1$ from the sub driver 144-1 is a signal delayed with respect to the input signal illustrated in FIG. 21A and having the amplitude adjusted.

As illustrated in FIG. 21C, the non-inverted signal $V_2$ outputted from the sub driver 144-1 is a signal delayed with respect to the input signal illustrated in FIG. 21A by a delay time 2×td and having a waveform having the amplitude adjusted.

As illustrated in 21D, the non-inverted signal $V_3$ outputted from the sub driver 144-3 is a signal delayed with respect to the input signal illustrated in FIG. 21A and having a waveform and having the amplitude adjusted.

As illustrated in FIG. 21E, the output signal $V_{out}$ of the driver circuit 142 according to the present embodiment is a signal of a waveform produced by adding the output signal of the main driver 18 to the non-inverted signals $V_1, V_2, V_3$ from the plural sub-driers 144-1, 144-2, 144-3.

In the low frequency emphasizing operation, as illustrated in FIG. 21E, the non-inverted signal $V_1$, the non-inverted signal $V_2$ delayed by a delay time 2×td and the non-inverted signal $V_3$ are added to the output signal of the main driver 18, whereby a low frequency emphasized signal $V_{out}$ having the low frequency emphasized, i.e., a simulated signal $V_{out}$ simulating a signal subjected to the transmission loss is digitally generated.

As described above, the driver circuit 142 according to the present embodiment, in the low frequency emphasizing operation, adds the plural non-inverted signals sequentially delayed by the plural variable delay circuits 134-1, 134-2, 134-3, ... to the output signal of the main driver 18, whereby low frequency emphasized signals can be digitally generated.

FIG. 22 shows waveforms of signals at respective points of the structure illustrated in FIG. 20 in the high frequency emphasizing operation. In FIG. 22 as well, it is directed to the situation where three variable delay circuits, three sub drivers and three addition circuits are provided. FIG. 22 A illustrates the waveform of an input signal to the driver circuit 142 according to the present embodiment. FIG. 22B illustrates the waveform of an inverted signal $V_{1B}$ from the sub driver 144-1. FIG. 22C illustrates the waveform of an inverted signal $V_{2B}$ from the sub driver 144-2. FIG. 22D illustrates the waveform of an inverted signal $V_{3B}$ from the sub driver 14-3. FIG. 22E illustrates the waveform of an output signal of the driver circuit 142 according to the present embodiment.

Figure 22A:
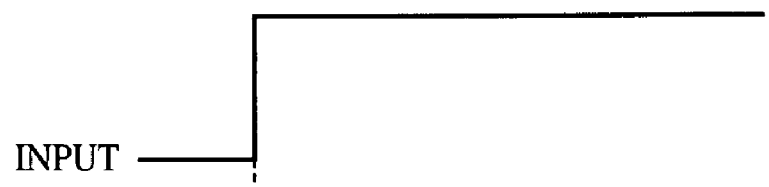
FIG. 22 is a view (Part 2) showing the waveforms of the signals at respective points of the driver circuit according to the eighth embodiment of the present invention.
Figure 23:
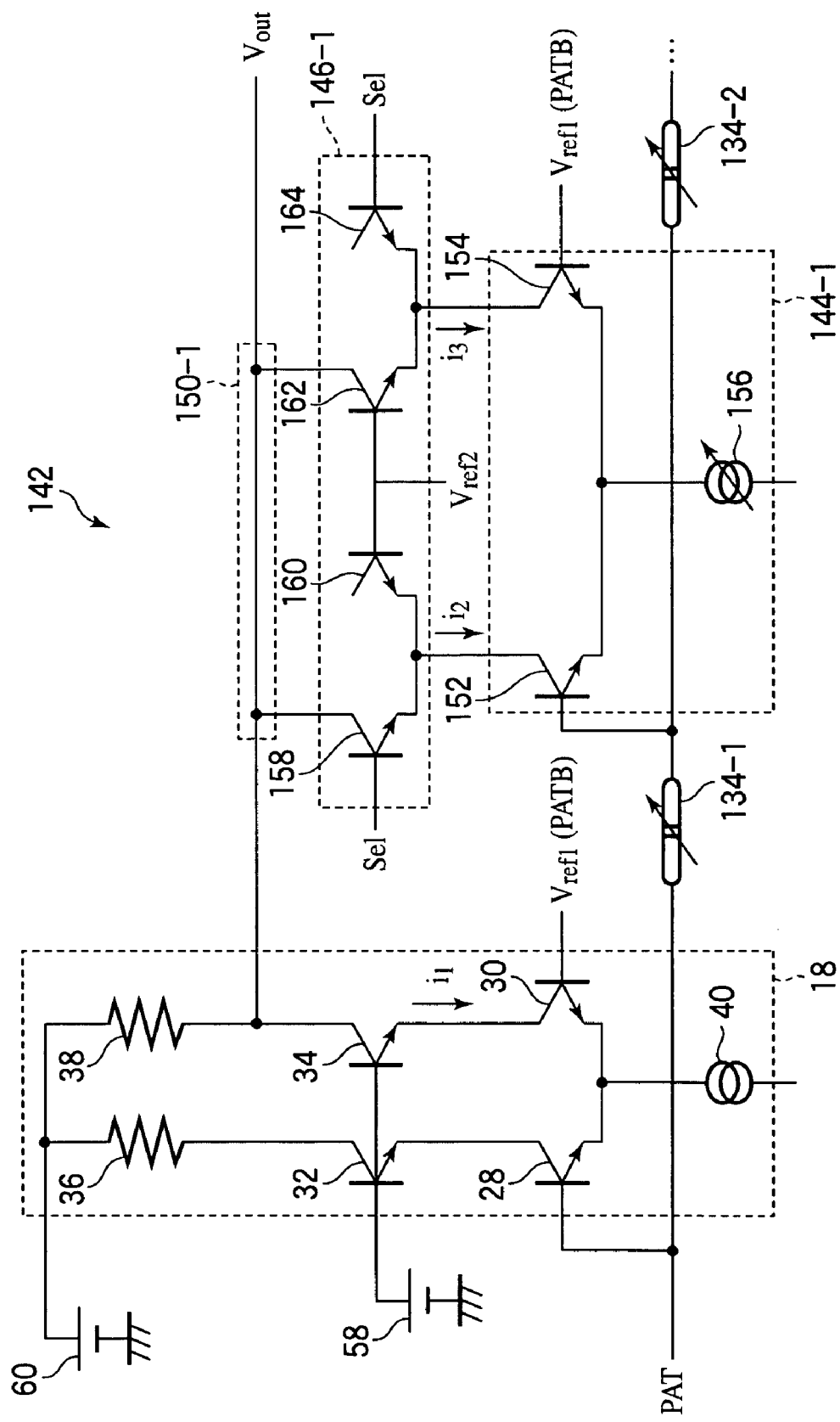
FIG. 23 is a circuit diagram illustrating an example of circuit structure of the driver circuit according to the eighth embodiment of the present invention.

The input signal illustrated in FIG. 22A is supplied to the main driver 18 and the plural variable delay circuit 134-1, 134-2, 134-3.

The output signal of the main driver 18 is a signal of the same waveform as that of the input signal illustrated in FIG. 22A.

Figure 22B:

As illustrated in FIG. 22B, the inverted signal $V_{1B}$ outputted from the sub driver 144-1 is a signal delayed with respect to an input signal illustrated in FIG. 22A by a delay time td and having a waveform having the amplitude adjusted.

Figure 22C:

As illustrated in FIG. 22C, the inverted signal $V_{23}$ outputted from the sub driver 144-2 is a signal delayed with respect to an input signal illustrated in FIG. 22A by a delay time 2×td and having a waveform having the amplitude adjusted.

Figure 22D:

As illustrated in FIG. 22D, the inverted signal $V_{3B}$ outputted from the sub driver 144-3 is a signal delayed with respect to the input signal illustrated in FIG. 22A by a delay tine 3×td and having a waveform having the amplitude adjusted.

Figure 22E:
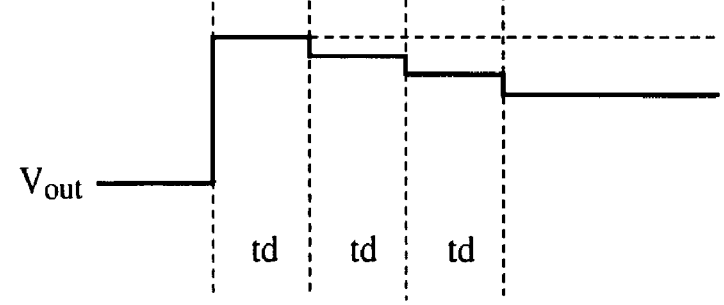

As illustrated in FIG. 22E, the output signal $V_{out}$ of the driver circuit 142 according to the present embodiment is a signal of a waveform given by adding to an output signal of the may driver 18 inverted signals $V_{1B}, V_{2B}, V_{3B}$ outputted from the plural sub drivers 144-1, 144-2, 144-3.

in the high frequency emphasizing operation, as illustrated in FIG. 22E, an inverted signal $V_{1B}$ delayed by a delay time td, an inverted signal $V_{2B}$ delayed by a delay time 2×td and an inverted signal $V_{3B}$ delayed by a delay time 3×td are added to an output signal of he main driver 18, whereby a high frequency emphasized signal $V_{out}$ having the high frequency emphasized is digitally generated.

As described above, the driver circuit 143 according to the present embodiment, in the high frequency emphasizing operation, add plural inverted signals sequentially delayed by the plural variable delay circuits 134-1, 134-2, 134-3, . . . to an output signal of the main driver 18, whereby a high frequency emphasized signal can be digitally generated.

In the driver circuit 142 according to the present embodiment, delay times td given by the plural variable delay circuits 134-1, 134-2, 134-3, . . . are suitably varied to thereby suitably vary an adjustment magnitude of a delay time by the plural sub drivers 144-1, 144-2, 144-3, . . . , whereby an emphasis magnitude of the high frequency or the low frequency of a high frequency emphasizing signal or a low frequency emphasizing signal is varied, and its waveform can be shaped into an arbitrary waveform.

Next, the specific circuit structure of the driver circuit 142 according to the present embodiment will be explained with reference to FIGS. 23 and 24. In the circuit diagram illustrated in FIG. 23, as the variable delay circuit, the sub driver, the select switch and the addition circuit, variable delay circuits 134-1. 134-2, a sub driver 144-1, a select switch 146-1 and an addition circuit 150-1 alone are illustrated.

The structure of the main driver 18 is the same as that of the first embodiment illustrated in FIG. 5.

The sub driver 144-1 comprises two transistors 152, 154, and a variable constant current circuit 156 commonly connected to the emitters of the two transistors 152, 154. To the base of the sub driver 144-1, the associated variable delay circuit 134-1 is connected. The other sub drivers 144-2, 144-3 have the same circuit structure.

The select switch 146-1 comprises transistors 158, 160 having the emitters connected to the collector of the transistor 154 of the sub driver 144-1, and transistors 162, 164 having the emitters connected to the collector of the transistor 154 of the sub driver 144-1. The other select switches 146-2, 146-3, . . . have the same circuit structure.

Figure 24A:
FIG. 24 shows the waveforms of signals at respective points of the specific circuit structure of the driver circuit according to the eighth embodiment of the present invention.
Figure 24B:

In the main driver 18, to the base of one transistor 28, a signal PAT generated by the signal generating unit is inputted. FIG. 24A illustrates the waveform of a signal (voltage) PAT inputted by the signal generating unit. To the base of the other transistor 30, a signal of a prescribed reference voltage $V_{ref1}$ (PATB) is inputted. Thus, from the collector of the transistor 30, a signal of the same waveform as that inputted to the base of the transistor 28 is outputted. FIG. 24B illustrates the waveform of a signal (current) $i_1$ flowing from the emitter of the transistor 34 to the collector of the transistor 30. The signal from the collector of the transistor 30 is outputted as an output signal of the main driver 18 via the transistor 34.

Thus, from the collector of the transistor 152, an inverted signal of the signal inputted to the base of the transistor 152 is generated. Here, a current flowing in the variable constant current circuit 156 is varied, whereby an amplitude of an inverted signal to be outputted from the collector of the transistor 152 can be adjusted. FIG. 23C illustrates the waveform of a signal (current) $i_2$ flowing at this time from the emitter of the transistor 158 to the collector of the transistor 152.

The signal outputted from the collector of the transistor 152 is inputted to the select switch 146-1.

Figure 24C:
Figure 24D:
Figure 24E:
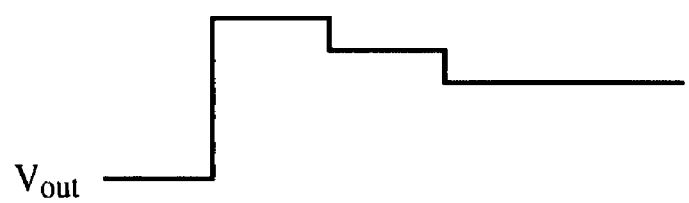

From the collector of the transistor 154, a signal of the same waveform as that of a signal inputted to the base of the transistor 152 is outputted. Here, a current flowing in the variable constant current circuit 156 is varied, whereby an amplitude of a non-inverted signal outputted from the collector of the transistor 154 can be adjusted. FIG. 24D illustrates the waveform of a signal (current) $i_3$ flowing at this time from the emitter of the transistor 162 to the collector of the transistor 154.

A signal outputted from the collector of the transistor 154 is inputted to the select switch 146-1.

In the select switch 146-1, a signal from the collector of the transistor 152 is inputted to the emitter sides of the transistor 158 and the transistor 160. A signal from the collector of the transistor 154 is inputted to the emitters of the transistor 162 and the transistor 164. Here, a signal of a prescribed reference voltage $V_{ref2}$ is inputted to the bases of the transistors 160, 162, and a select signal Sel is inputted to either of the bases of the transistors 158, 164.

First, in the high frequency emphasizing operation, a select signal Sel is inputted to the base of the transistor 158. Thus, an inverted signal from the base of the transistor 152 of the sub driver 144-1 is outputted to the collector of the transistor 158.

An inverted signal outputted from the collector of the transistor 158 is added to an output signal of the main driver 18 by the addition circuit 150-1.

The other sub drivers, the other select switches and the other addition circuits operate also in the same way for signals sequentially delayed by a prescribed delay tine by the plural variable delay circuits.

Thus, in the high frequency emphasized operation, as an output signal $V_{out}$ of the driver circuit 142, a high frequency emphasized signal having the high frequency emphasized is digitally generated. FIG. 24C illustrates the waveform of an output signal (voltage) $V_{out}$ of the driver circuit 142 in the high frequency emphasizing operation.

In the low frequency emphasizing operation, a select signal Sel is inputted to the base of the transistor 164. Thus, a non-inverted signal from the collector of the transistor 154 of the sub driver 144-1 is outputted from the collector of the transistor 162.

In the low frequency emphasizing operation, a non-inverted signal outputted from the collector of the transistor 162 is added to an output signal of the main driver 18 by the addition circuit 150-1.

The other sub drivers, the other select switches and the other addition circuits operate also in the same way for signals delayed by a prescribed delay time by the plural variable delay circuits.

Figure 24F:
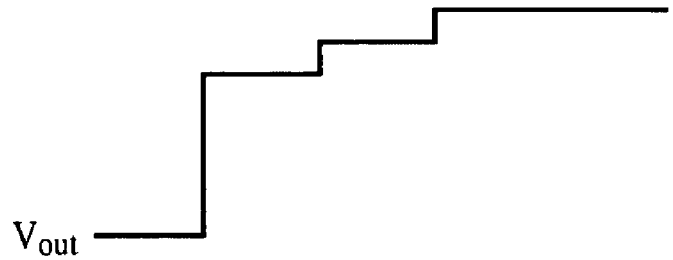

Thus, in the low frequency emphasizing operation, as an output signal $V_{out}$ of the driver circuit 142, a low frequency emphasized signal having the low frequency emphasized is generated. FIG. 24F illustrates the waveform of an output signal (voltage) $V_{out}$ of the driver circuit 142 in the low frequency emphasizing operation.

As described above, the driver circuit 142 according to the present embodiment adds plural inverted signals or plural non-inverted signals sequentially delayed by the plural variable delay circuits 134-1, 134-1, 134-3, . . . to an outputs signal of the main driver 18, whereby high frequency emphasized signals or low frequency emphasized signals can be digitally generated.

In the driver circuit 142 according to the present embodiment, a delay time td by the plural variable delay circuits 134-1, 134-2, 134-3, . . . are suitably varied to thereby suitably vary an adjustment magnitude of a delay time by the plural sub drivers 144-1, 144-2, 144-3, . . . , whereby an emphasis magnitude of the high frequency or the low frequency of a high frequency emphasizing signal or a low frequency emphasizing signal is varied, and its waveform can be shaped into an arbitrary waveform.

The numbers of the plural variable delay circuits 134-1, 134-2, 134-3, . . . , the plural sub drivers 144-1, 144-2, 144-3, . . . and the plural addition circuits 150-1, 150-2, 150-3, . . . can be suitably set in accordance with resolution, etc. necessary for an output signal of the driver circuit.

Modified Embodiments

The present invention is not limited to the above-described embodiments and can cover other various modifications.

For example, in the above-described embodiments, rectangular waveform pulse signals are supplied to the driver circuit by the signal generating unit 16. As signals to be supplied to the driver circuit by the signal generating unit 16 can be various signals, such as triangular waveform pulse signals, etc.

In the above-described embodiments, the main driver 18 outputs an output signal of the same waveform as that of an input signal. However, the main driver 18 may output as an output signal a non-inverted signal of a prescribed waveform corresponding to an input signal.

In the above-described embodiments, the sub drivers 20, 20-1, . . . , 20-n output output signals of an inverted waveform of an input signal. However, the sub drivers 20, 20-1, . . . , 20-n may output inverted signals of a prescribed waveform corresponding to an input signal.

In the above-described embodiments, the sub driver 80 outputs a differential signal of a non-inverted signal of the same waveform as that of an input signal and an inverted signal of an inverted waveform of the input signal. However, the sub driver 80 may output a differential signal of a non-inverted signal and an inverted signal, of a prescribed waveform corresponding to an input signal.

In the above-described embodiments, as the high frequency emphasizing circuits 22, 22-1, . . . , 22-n, 82, 84, differentiating circuits are used. As these high frequency emphasizing circuits, various bypass filters may be used. These high frequency emphasizing circuits may be passive circuits, such as filters or positive circuits generating the high frequency emphasizing signals.

In the second embodiment, the driver circuit comprises the amplification circuit 64 in addition to the structure of the driver circuit according to the first embodiment. The amplification circuit 64 may be added to the structure of the driver circuit according to the other embodiments.

In the sixth embodiment, the driver circuit comprises the phase modification circuit 118 in addition to the structure of the driver circuit according to the third embodiment. The phase modification circuit 118 may be added also to the driver circuit according to the other modifications.

In the above-described embodiments, the driver circuit according to the present invention is used in semiconductor test devices as a driver circuit for generating signals to test DUTs. The present invention is applicable not only to the driver circuits of semiconductor test devices, but also widely to driver circuits for supplying signals to connected circuits.

The driver circuit according to the present invention can generate variably simulated signals simulating signals subjected to transmission loss without the need of a complicated circuit structure. Accordingly, the present invention is useful to improve the accuracy of tests of the high frequency emphasizing circuit incorporated in DUTs.

The invention claimed is:

1. A driver circuit for outputting a simulated signal simulating an input signal subjected to transmission loss, corresponding to said input signal, the driver circuit comprising:
   a main driver which receives said input signal and outputs a first signal corresponding to said input signal;
   a sub driver which receives said input signal and outputs a second signal by inverting said input signal where said sub driver is a differential driver which further outputs a fourth signal corresponding to said input signal;
   a high frequency emphasizing circuit which receives said second signal and outputs a third signal having the high frequency of said second signal emphasized;
   an addition unit which outputs said simulated signal by adding said first signal to said third signal; and
   an additional high frequency emphasizing circuit which receives said fourth signal and outputs a fifth signal having the high frequency of said fourth signal emphasized; and
   wherein said addition unit outputs a signal by adding said fifth signal to said simulated signal or said first signal.

2. A driver circuit according to claim 1, wherein the high frequency emphasizing circuit is a differential circuit for outputting said third signal given by differentiating said second signal.

3. A driver circuit according to claim 1, which further comprises
   an amplification circuit which receives said simulated signal and amplifies said simulated signal.

4. A driver circuit according to claim 1, which further comprises
   a multiplication circuit which receives said third signal and adjusts an amplitude of said third signal, and
   wherein said addition unit outputs said simulated signal by adding said first signal to said third signal having the amplitude adjusted by said multiplication circuit.

5. A driver circuit according to claim 1, wherein said high frequency emphasizing circuit outputting said third signal, and said additional high frequency emphasizing circuit outputting said fifth signal are formed of a common differentiating circuit.

6. A driver circuit according to claim 1, which further comprises
   a phase modulation circuit which modifies a phase of said input signal to be inputted to said main driver and said sub driver.

7. A driver circuit for outputting a simulated signal simulating an input signal subjected to transmission loss, corresponding to said input signal, the driver circuit comprising:
   a main driver which receives said input signal and outputs a first signal corresponding to said input signal;
   a plurality of sub drivers which receive said input signal and output a plurality of second signals by inverting said input signal;
   a plurality of high frequency emphasizing circuits having time constants different from each other, which respectively receive said plurality of second signals from said plurality of sub drivers and output third signals having the high frequency of said second signals emphasized;
   a plurality of multiplication circuits which respectively receive said third signals from the plurality of high frequency emphasizing circuits and adjust the amplitude of said third signals; and
   an addition unit which outputs said simulated signal by adding said first signal to said third signals having the amplitude adjusted by said plurality of multiplication circuits.

* * * * *